(12) United States Patent
Hsu et al.

(10) Patent No.: US 11,287,745 B2
(45) Date of Patent: *Mar. 29, 2022

(54) RETICLE-MASKING STRUCTURE, EXTREME ULTRAVIOLET APPARATUS, AND METHOD OF FORMING THE SAME

(71) Applicant: TAIWAN SEMICONDUCTOR MANUFACTURING COMPANY LTD., Hsinchu (TW)

(72) Inventors: Ching-Hsiang Hsu, Hsinchu (TW); James Jeng-Jyi Hwang, Hsin-Chu County (TW); Feng Yuan Hsu, Yilan County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/121,588

(22) Filed: Dec. 14, 2020

(65) Prior Publication Data

US 2021/0096469 A1  Apr. 1, 2021

Related U.S. Application Data

(62) Division of application No. 16/589,616, filed on Oct. 1, 2019, now Pat. No. 10,866,519.

(51) Int. Cl.
*G03F 7/20* (2006.01)

(52) U.S. Cl.
CPC ...... *G03F 7/70066* (2013.01); *G03F 7/70033* (2013.01); *G03F 7/70191* (2013.01)

(58) Field of Classification Search
CPC .................................................. G03F 7/70066
See application file for complete search history.

(56) References Cited

U.S. PATENT DOCUMENTS 10,866,519 B1 * 12/2020 Hsu .................... G03F 7/70191
2005/0275835 A1 * 12/2005 Sogard ................ G03F 7/70916
356/237.2

* cited by examiner

*Primary Examiner* — Steven Whitesell Gordon
(74) *Attorney, Agent, or Firm* — WPAT, P.C., Intellectual Property Attorneys; Anthony King

(57) ABSTRACT

A reticle-masking structure is provided. The reticle-masking structure includes a magnetic substrate and a paramagnetic part disposed on the magnetic substrate. The paramagnetic part includes a plurality of fractions disposed on a plurality of protrusion structures. In some embodiments, the protrusion structures are irregularly arranged. A method for forming a reticle-masking structure and an extreme ultraviolet apparatus are also provided.

20 Claims, 25 Drawing Sheets

RETICLE-MASKING STRUCTURE, EXTREME ULTRAVIOLET APPARATUS, AND METHOD OF FORMING THE SAME

PRIORITY CLAIM AND CROSS-REFERENCE

This patent is a divisional application of U.S. patent application Ser. No. 16/589,616 filed on Oct. 1, 2019, entitled of "RETICLE-MASKING STRUCTURE, EXTREME ULTRAVIOLET APPARATUS, AND METHOD OF FORMING THE SAME", which is incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling-down process generally provides benefits by increasing production efficiency and lowering associated costs while increasing the amount of functionality that can be provided in the reduced chip area. Such scaling down has also increased the complexity of processing and manufacturing ICs.

EUV ("extreme ultraviolet") lithography techniques are used in the semiconductor manufacturing industry to produce feature sizes of smaller dimensions and patterns with superior resolution compared to other lithography techniques. EUV lithography techniques utilize electromagnetic radiation with wavelengths of about 13.5 nanometers, which is between visible light and x-ray on the electromagnetic spectrum. The short wavelength enables greater resolution and accurate production of smaller features. The EUV light beams are reflected from a reticle and impinge upon the substrate surface, where the EUV radiation chemically alters the exposed photoresist. Thus, particles and contaminants on the reticle significantly influence patterns of the exposed photoresist.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
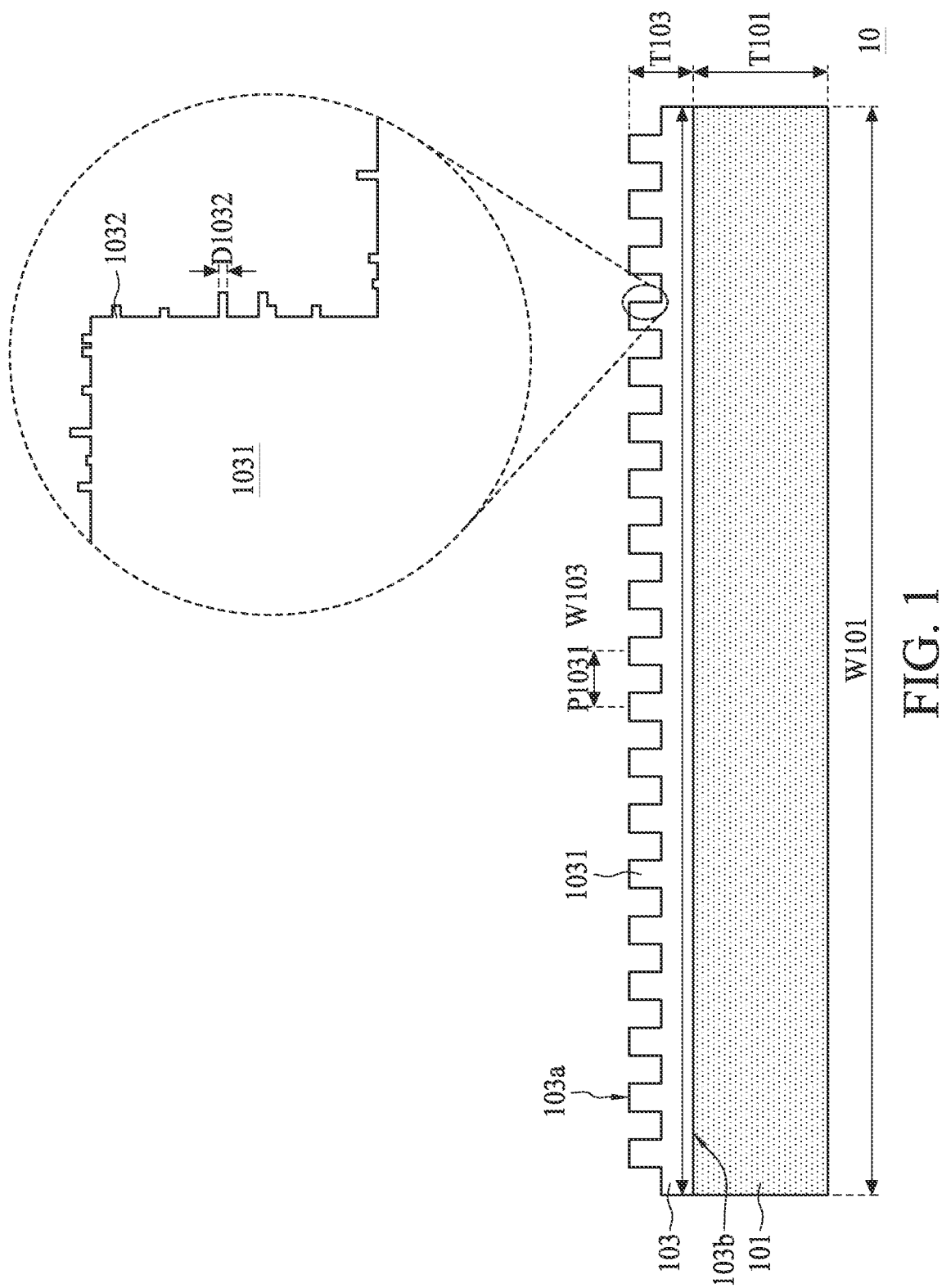
FIGS. 1 to 2 are cross-sectional diagrams of reticle-masking structures in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the current disclosure.

A reticle-masking unit is positioned in a wafer stepper between the wafer being exposed and the light source, and its function is analogous to the aperture diaphragm in a conventional camera and selectively blocks reticle so that patterns over the reticle are not transferred to a photoresist over a wafer. It moves very rapidly and is irradiated by the light source, and fractions created during the manufacturing of the reticle-masking unit can be removed by receiving energies from the light source or the operations during the lithography. The fractions or particles fallen off from the reticle-masking unit can be a pollution to the reticle, the wafer or the chamber. Exposure operation is influenced dramatically if the fractions fall on the reticle or are close to the reticle on an optical path of the light source in the lithograph. However, formation of the fractions is almost unavoidable or difficult to completely prevent due to technical limitations.

The present disclosure is to provide a reticle-masking structure to mitigate the fraction or particle falling issue. In some embodiments, the reticle-masking structure can be referred to a reticle-masking (REMA) structure. The reticle-masking structure has a magnetic field to attract the fractions, and the fractions of the reticle-masking structure are very unlikely to drop off during the lithography.

FIG. 1 shows a reticle-masking structure 10 in accordance with some embodiments of the present disclosure. In some embodiments, the reticle-masking structure 10 includes a magnetic substrate 101 and a paramagnetic part 103. The magnetic substrate 101 has a magnetic field. The paramagnetic part 103 is disposed on the magnetic substrate 101 and has an induced magnetic field having a direction matching that of the magnetic field of the magnetic substrate 101. In some embodiments, the paramagnetic part 103 includes a rough surface 103a and a planar surface 103b opposite to the rough surface 103a. The paramagnetic part 103 includes a plurality of protrusion structures 1031. A shape of the plurality of protrusion structures 1031 is not limited herein. In some embodiments, the plurality of protrusion structures is in a pillar shape (as shown in FIG. 1), a pyramid shape, a cone shape, a frustum shape, and/or a scallop (curved) shape. The plurality of protrusion structures 1031 are proximal to the rough surface 103a and define the rough surface 103a. The magnetic substrate 101 is disposed on the planar surface 103b of the paramagnetic part 103. The paramagnetic part 103 is attracted by the magnetic field of the magnetic substrate 101, and an induced magnetic field in the direction of the magnetic field of the magnetic substrate 101 is formed in the paramagnetic part 103.

In some embodiments, the paramagnetic part 103 is attached to or bonded on the magnetic substrate 101 by one or more of screwing, gluing, welding, electroplating and magnetic attraction. In some embodiments, the magnetic substrate 101 and the paramagnetic part 103 are both made of stainless steel, because stainless steel exhibits good absorptance of EUV light. In some embodiments, the paramagnetic part 103 is made of stainless steel, and the magnetic substrate 101 includes other suitable magnetic materials. In some embodiments, the paramagnetic part 103 overlaps the entire magnetic substrate 101. In some embodiments, the paramagnetic part 103 has a width W103 substantially equal to a width W101 of the magnetic substrate 101. In some embodiments, the width W103 of the paramagnetic part 103 is greater than the width W101 of the magnetic substrate 101 as long as the magnetic field of the magnetic substrate 101 is strong enough to form the induced magnetic field in the entire paramagnetic part 103.

In some embodiments, a thickness T101 of the magnetic substrate 101 is in a range of 1 to 20 millimeters for good attractions of the magnetic substrate 101 to the paramagnetic part 103. In some embodiments, a thickness T103 of the paramagnetic part 103 is in a range of 100 micrometers to 5 millimeters. In some embodiments, if the thickness T103 is smaller than 100 micrometers, it increases the difficulty of fabrication. In some embodiments, if the thickness T103 is greater than 5 millimeters, it increases manufacturing cost with less improvement. In some embodiments, the protrusion structures 1031 are regularly arranged, as shown in FIG. 1. In some embodiments, the reticle-masking structure 10 further includes an adhesion layer between the magnetic substrate 101 and the paramagnetic part 103. In some embodiments, the reticle-masking structure 10 further includes one or more screws connecting the paramagnetic part 103 and the magnetic substrate 101. In some embodiments, a pitch P1031 between adjacent protrusion structures 1031 is in a range of 50 nanometers to 500 micrometers, wherein the pitch P1031 is defined by a distance between centers of the adjacent protrusion structures 1031, as shown in FIG. 1. In some embodiments with the pitch of the protrusion structures 1031 out of the range 50 nanometers to 500 micrometers, the results of light diffusion and light trapping are worse. In some embodiments, a top of the protrusion structure 1031 is in a rounded configuration instead of a rectangular configuration.

The paramagnetic part 103 of the reticle-masking structure 10 further includes a plurality of fractions 1032 disposed on the protrusion structures 1031, as shown in an enlarged view of a portion of the paramagnetic part 103 shown in the dotted circle in FIG. 1. In some embodiments, the fractions 1032 are paramagnetic materials same as the material of the paramagnetic part 103. In some embodiments, the fractions 1032 are pillar-like, irregular, micro-branch, or micro-bulge paramagnetic fractions. In some embodiments, the fractions 1032 are paramagnetic particles. In some embodiments, the paramagnetic particles have rounded and/or irregular configurations. In some embodiments, some of the fractions 1032 and the protrusion structure 1031 are monolithic. In some embodiments, some of the fractions 1032 attached on the protrusion structure 1031 by magnetic attraction and Van der Waals forces. In some embodiments, the plurality of fractions 1032 is not a designed structure in the manufacturing process, and a dimension of the plurality of fractions 1032 is smaller than a dimension of the protrusion structure 1031. In some embodiments, a diameter D1032 of the plurality of fractions 1032 is less than 1 micron.

In some embodiments, a material of the paramagnetic part 103 includes stainless steel having a non-face-centered cubic structure. In some embodiments, a material of the paramagnetic part 103 is selected from the group consisting of ferritic stainless steel, martensite stainless steel, precipitation-hardened stainless steel, and duplex stainless steel. In some embodiments, a material of the magnetic substrate 101 includes stainless steel, aluminum, nickel, iron, chromium, neodymium, boron, samarium, cobalt, or an alloy thereof. In some embodiments, the magnetic substrate 101 is one or more of neodymium magnet (NdFeB magnet), samarium-cobalt (SmCo) magnet, and ferrite magnet. In some embodiments, the materials of the paramagnetic part 103 and the magnetic substrate 101 are different. In some embodiments, the materials of the paramagnetic part 103 and the magnetic substrate 101 are the same.

In some embodiments, the magnetic substrate 101 is a permanent magnet. In some embodiments, the magnetic substrate 101 includes ferromagnetic materials with high magnetic coercivity (i.e., magnetically "hard" materials). In some embodiments, the magnetic substrate 101 is an electromagnet, including a coil of wires and a core of ferromagnetic materials with low coercivity (i.e., magnetically "soft" materials). In some embodiments, the magnetic substrate 101 is electrically connected to a power supply or a current generator. In some embodiments, the magnetic substrate 101 is electrically connected to the power supply or the current generator through a wire.

Figure 2:
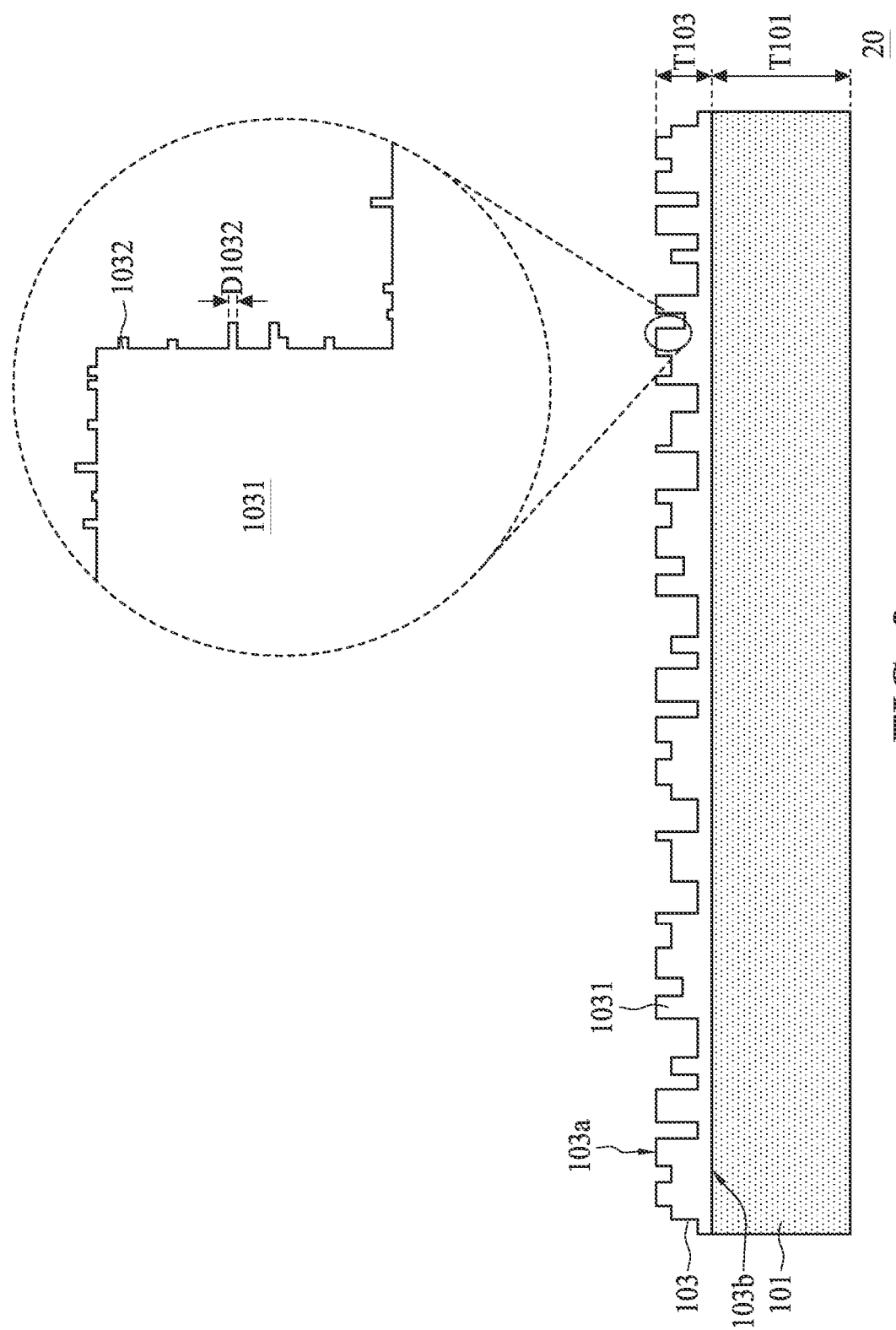

In some embodiments, the protrusion structures 1031 are irregularly arranged. FIG. 2 shows a reticle-masking structure 20 in accordance with some embodiments of the present disclosure. In some embodiments, as shown in FIG. 2, a plurality of protrusion structures 1031 of a paramagnetic part 103 having different heights and different diameters are disposed on a magnetic substrate 101. The protrusion structures 1031 are irregularly arranged, and some of the protrusion structures 1031 are separated from adjacent protrusion structures 1031, while others of the protrusion structures 1031 contact adjacent protrusion structures 1031. In some embodiments, a top of the protrusion structure 1031 is in a rounded configuration instead of a rectangular configuration. The protrusion structures 1031 of the reticle-masking structure 20 are formed by a technique different from a technique used in formation of the protrusion structures 1031 of the reticle-masking structure 10. The paramagnetic part 103 of the reticle-masking structure 20 may further include a plurality of fractions 1032 similar to the fractions 1032 of the reticle-masking structure 10. Detailed formation of the reticle-masking structures 10 and 20 are illustrated in the following description.

Figure 3:
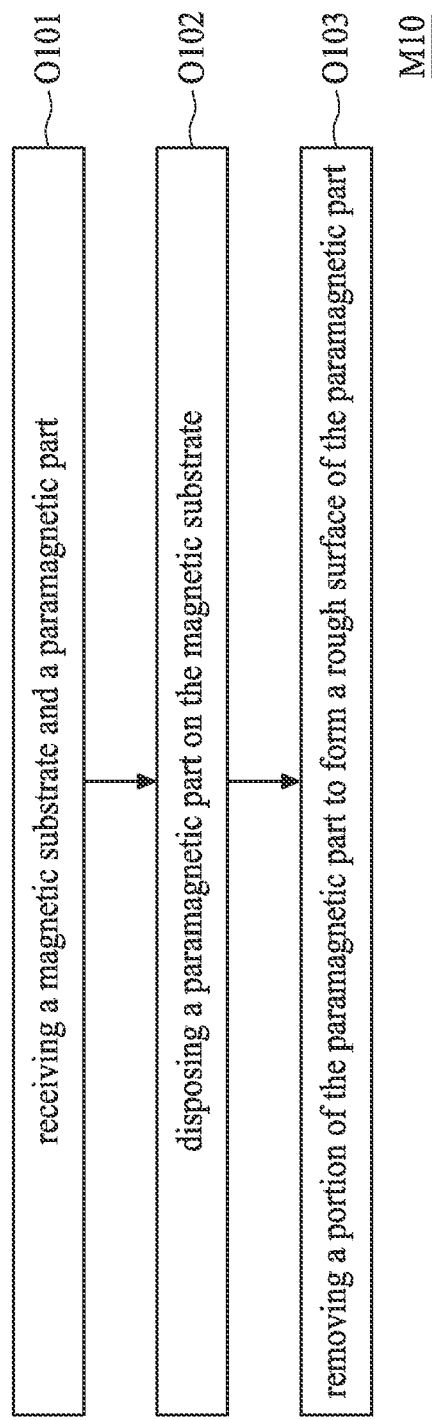
FIG. 3 is a flowchart showing various steps of a method for forming a reticle-masking structure in accordance with some embodiments of the present disclosure.

FIG. 3 shows a flowchart of a method M10 for forming a reticle-masking structure. The method M10 includes steps of: (O101) receiving a magnetic substrate; (O102) disposing a paramagnetic part on the magnetic substrate; and (O103) removing a portion of the paramagnetic part to form a rough surface of the paramagnetic part. It should be noted that the operations O101, O102 and O103 of the method M10 may be rearranged in sequence or otherwise modified within the scope of the various aspects.

In order to illustrate concepts and the method M10 of the present disclosure, various embodiments are provided below. However, it is not intended to limit the present disclosure to specific embodiments. In addition, elements, conditions or parameters illustrated in different embodiments can be combined or modified to form different combinations of embodiments as long as the elements, parameters or conditions used are not conflicted. For ease of illustration, reference numerals with similar or same functions and properties are repeatedly used in different embodiments and figures, but this is not intended to limit the present disclosure to specific embodiments.

Figure 4:
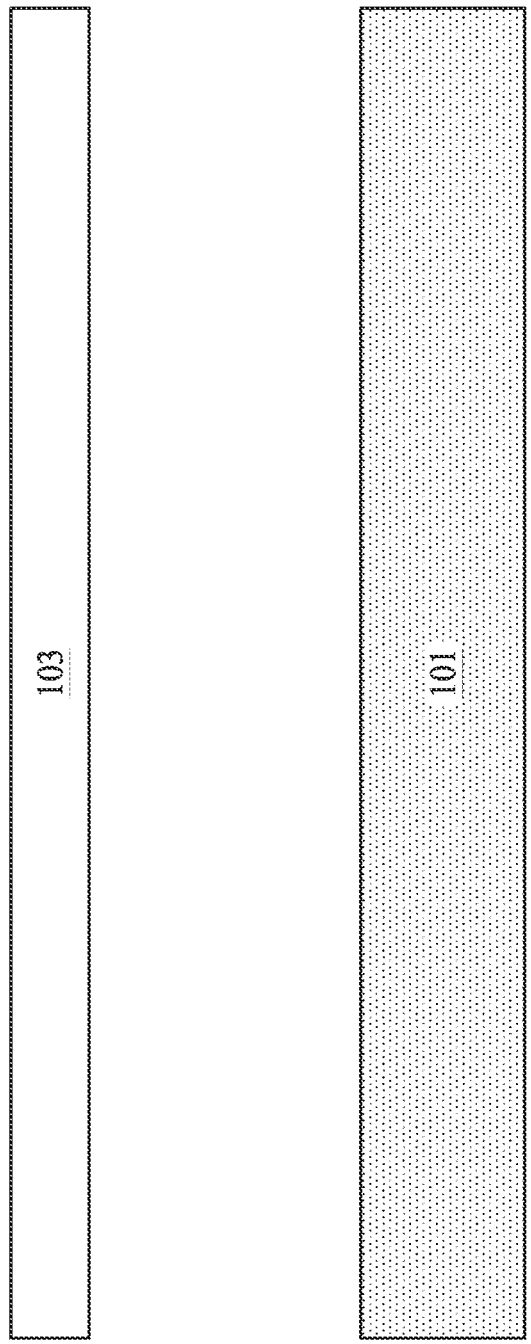
FIGS. 4 to 7 are cross-sectional diagrams of a reticle-masking structure at various stages of manufacture by a method in accordance with some embodiments of the present disclosure.
Figure 11:
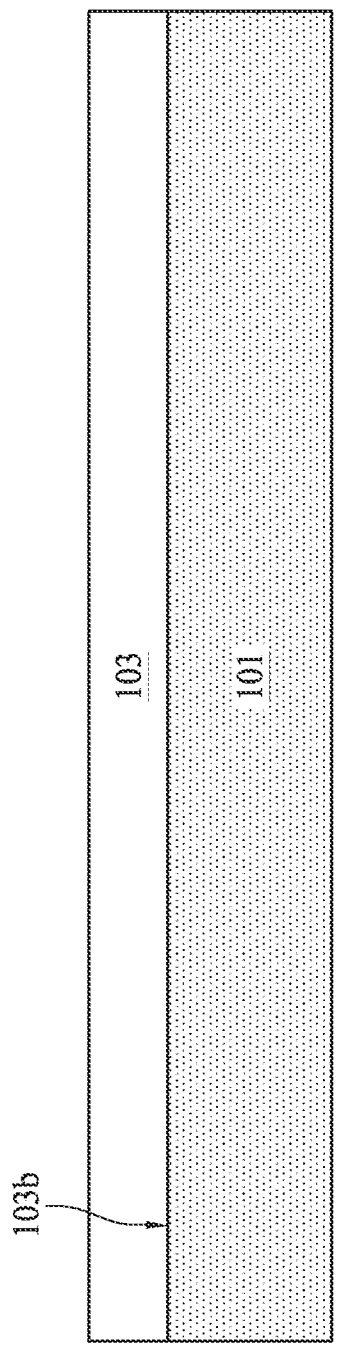
FIGS. 11 to 13 are cross-sectional diagrams of a reticle-masking structure at various stages of manufacture by a method in accordance with some embodiments of the present disclosure.
Figure 12:
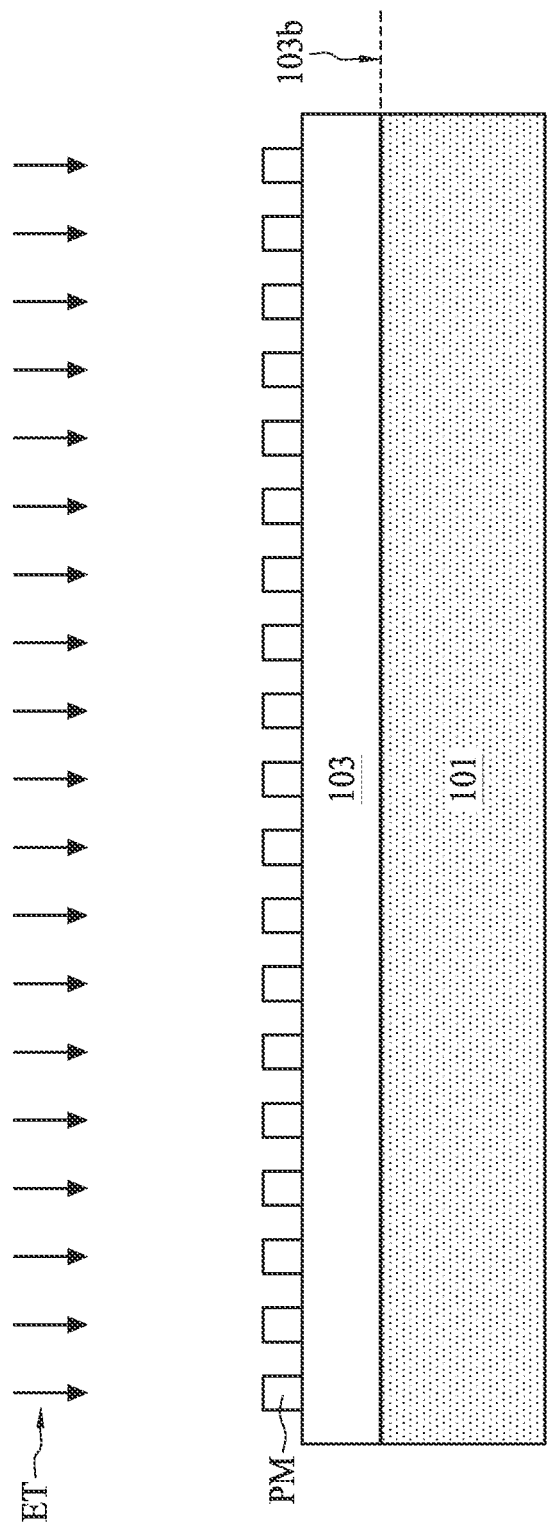
Figure 13:
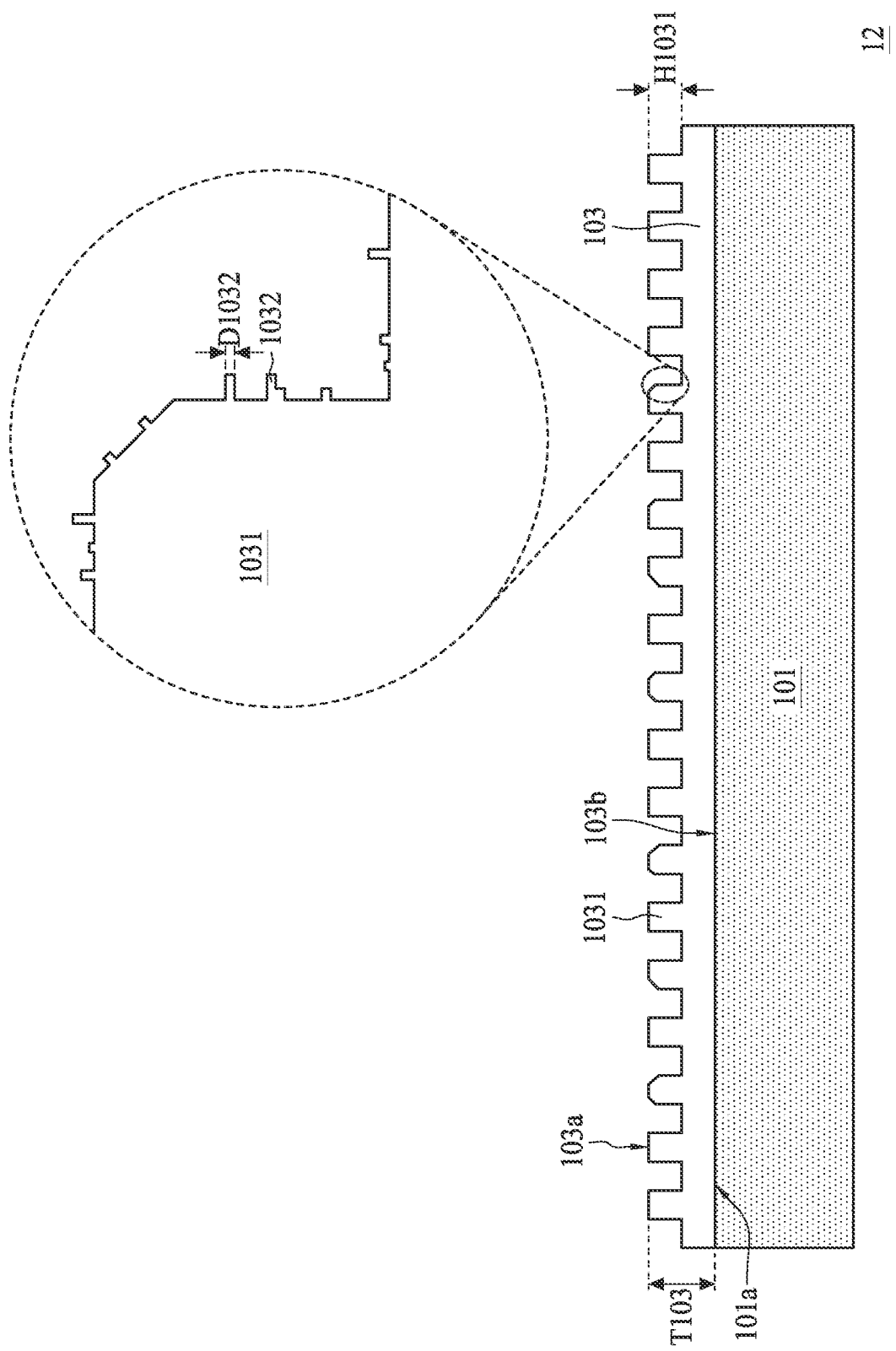

FIG. 4 shows a cross-sectional diagram in accordance with some embodiments of the present disclosure and the operation O101 of the method M10. A magnetic substrate 101 is received. In some embodiments, a paramagnetic part 103 is also received. In some embodiments, the paramagnetic part 103 is processed to form a rough surface 103a prior to disposing the paramagnetic part 103 on the magnetic substrate 101, as shown in FIGS. 5 to 7 and FIGS. 8 to 10. In some embodiments, a paramagnetic part 103 is formed on the magnetic substrate 101 prior to formation of the rough surface 103a, as shown in FIGS. 11 to 13.

Figure 5:
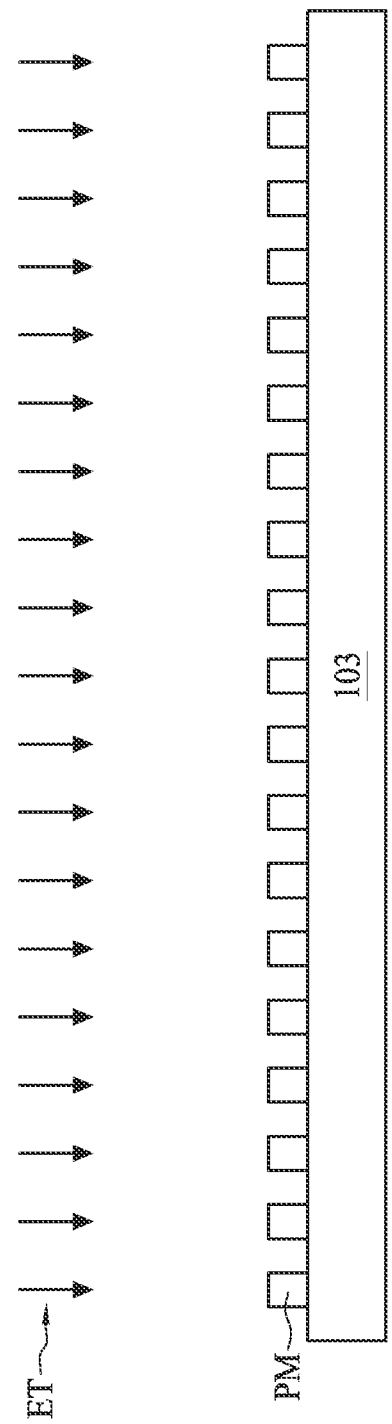
Figure 6:
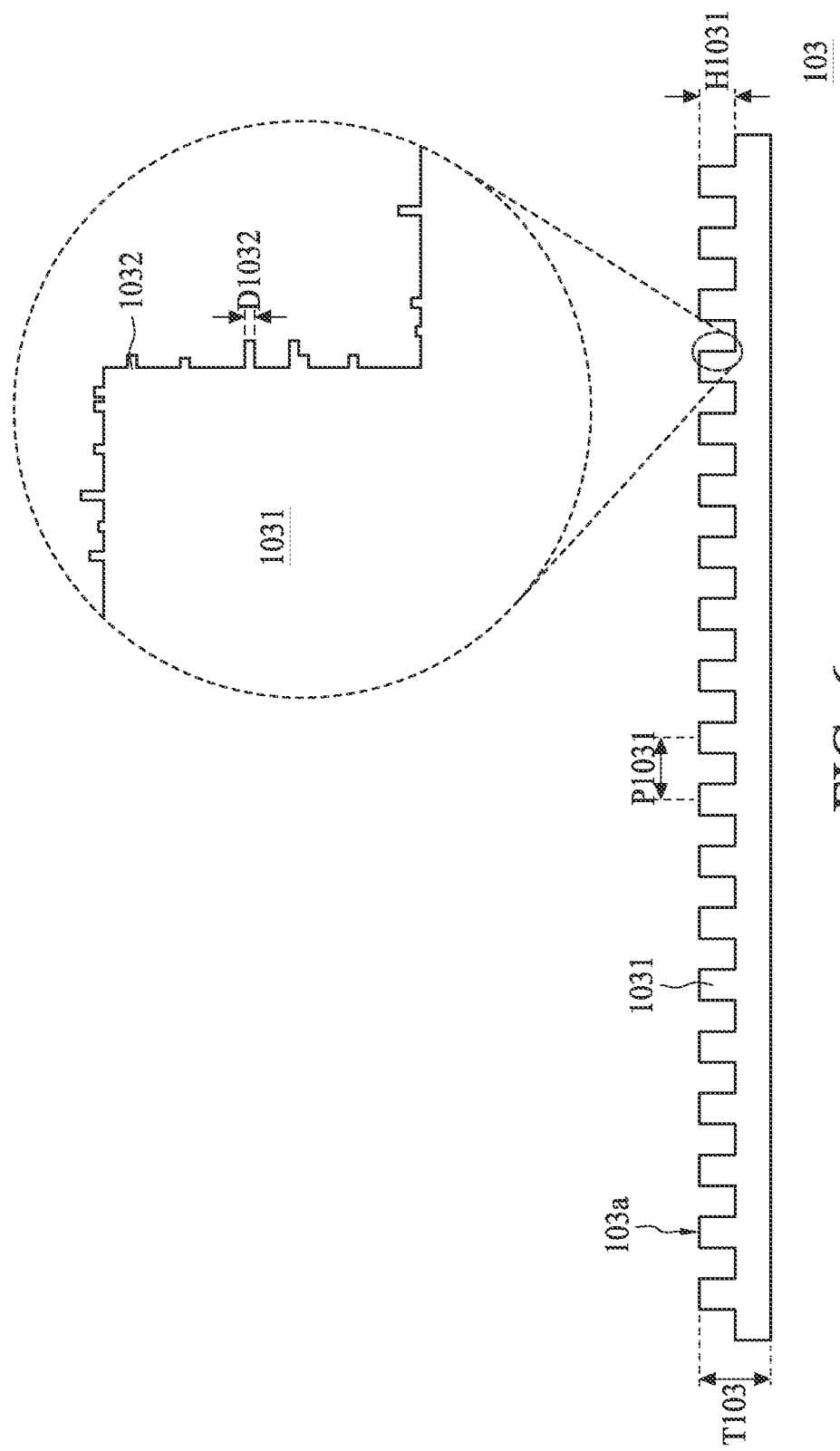

FIGS. 5 and 6 are cross-sectional diagrams in accordance with some embodiments of the present disclosure and the operation O103 of the method M10. In some embodiments, as shown in FIG. 5, a patterned mask layer PM is formed on the paramagnetic part 103 received in the operation O101, and a portion of the paramagnetic part 103 exposed through the patterned mask layer PM is removed by a process ET. In some embodiments, the process ET includes a wet etching operation. In some embodiments, the process ET includes a plasma dry etching operation. In some embodiments, the process ET includes a laser etching. In some embodiments, as shown in FIG. 6, the pattern of the patterned mask layer PM is transferred to the paramagnetic part 103 to form a plurality of protrusion structures 1031 and a rough surface 103a, wherein the plurality of protrusion structures 1031 define the rough surface 103a. In the embodiments using the patterned mask layer PM to form the rough surface 103a, a pattern of the rough surface 103a is designed or predetermined, and the pattern of the rough surface 103a is regulated. In some embodiments, pitches P1031 between adjacent protrusion structures 1031 are consistent among the plurality of protrusion structures 1031. In some embodiments, the pitches P1031 between adjacent protrusion structures 1031 vary among the protrusion structures 1031. In some embodiments, a height H1031 of the protrusion structure 1031 is smaller than a thickness T103 of the paramagnetic part 103. In some embodiments, the heights H1031 of the protrusion structures 1031 are similar or substantially the same.

In some embodiments, branch-like, bulge-like, pillar-like or irregular residues, fractions, micro branches, and/or micro bulges of the paramagnetic part 103 are formed on the plurality of protrusion structures 1031 during removal of the portion of the paramagnetic part 103. In some embodiments, a cleaning operation or a surface treatment is performed after the removal operation of the portion of the paramagnetic part 103, and some of the residues, fractions, branches and/or bulges are removed by the cleaning operation. However, some of the residues fractions, branches and/or bulges are left remaining on the protrusion structures 1031, e.g., by Van der Waals forces, or fall back onto the rough surface 103a, to form a plurality of fractions 1032.

In some embodiments, the fractions 1032 are pillar-like, irregular, micro-branch, or micro-bulge paramagnetic fractions formed on the rough surface 103a during formation of the rough surface 103a and remained after the cleaning operation. In some embodiments, the fractions 1032 are paramagnetic particles formed from cracking of the pillar-like or irregular paramagnetic fractions, micro branches, or micro bulges during cleaning operations or surface treatments. In some embodiments, connections or adhesions between the rough surface 103a and fractions 1032 are tenuous, and the fractions 1032 at this stage are easily to separate from the rough surface 103a if applied in an EUV lithographic operation.

Figure 7:
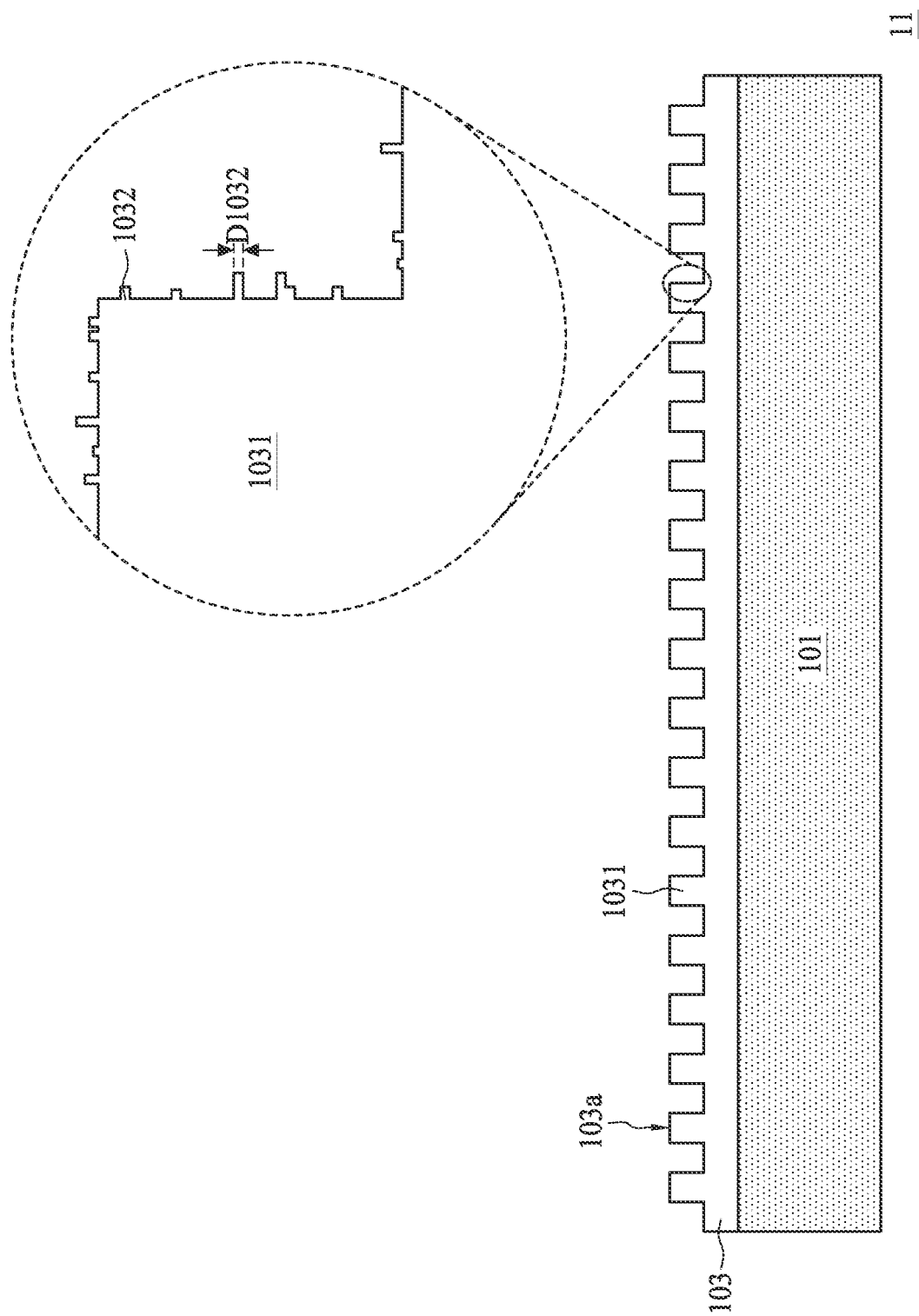

FIG. 7 is a cross-sectional diagram in accordance with some embodiments of the present disclosure and shows the operation O102 of the method M10 applied to the paramagnetic part 103 of FIG. 6. The paramagnetic part 103, with the rough surface 103a, is disposed on the magnetic substrate 101 to form a reticle-masking structure 11 similar to the reticle-masking structure 10. In some embodiments, the regular protrusion structures 1031 are configured to trap EUV radiation beams between the protrusion structures 1031. In some embodiments, another cleaning operation is performed after disposing the paramagnetic part 103 on the magnetic substrate 101.

In order to form a reticle-masking structure 21 similar to the reticle-masking structure 20, in some embodiments, a sandblasting operation is performed instead of the forming of the patterned mask layer PM and the performing of the process ET. FIGS. 8 to 11 are cross-sectional diagrams in accordance with some embodiments of the present disclosure, wherein the operation O103 is performed prior to the operation O102, and the sandblasting operation is performed to form an irregular rough surface 103a of a paramagnetic part 103.

Figure 8:
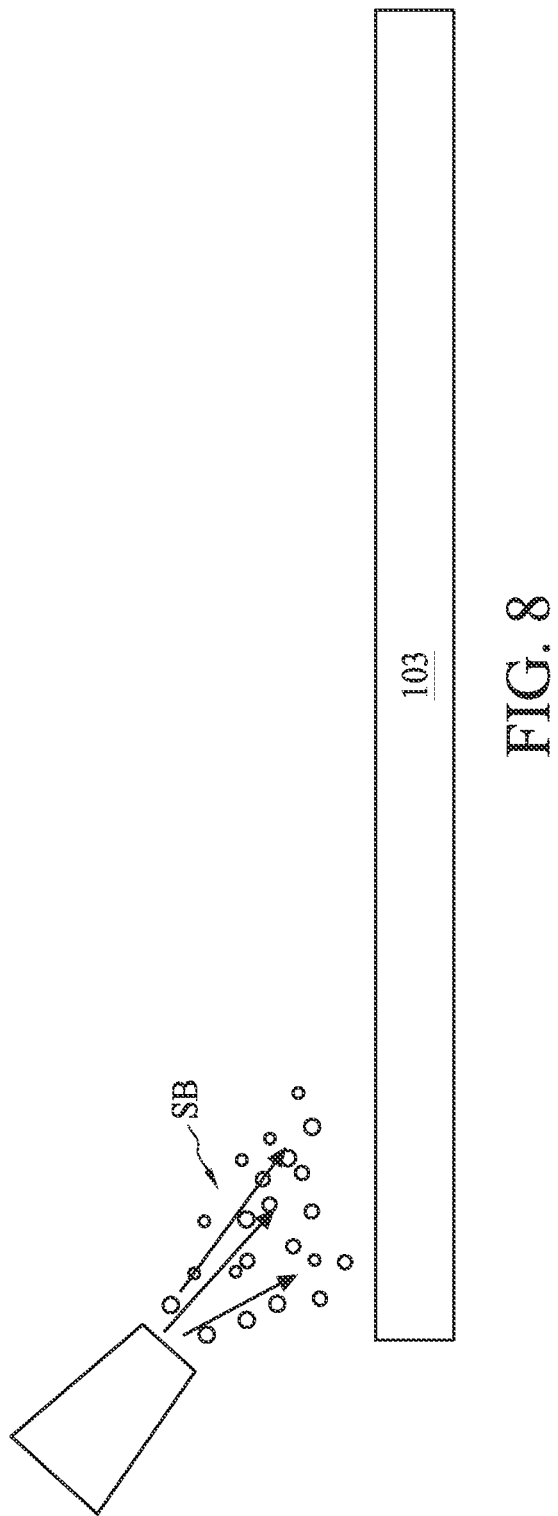
FIGS. 8 to 10 are cross-sectional diagrams of a reticle-masking structure at various stages of manufacture by a method in accordance with some embodiments of the present disclosure.
Figure 9:
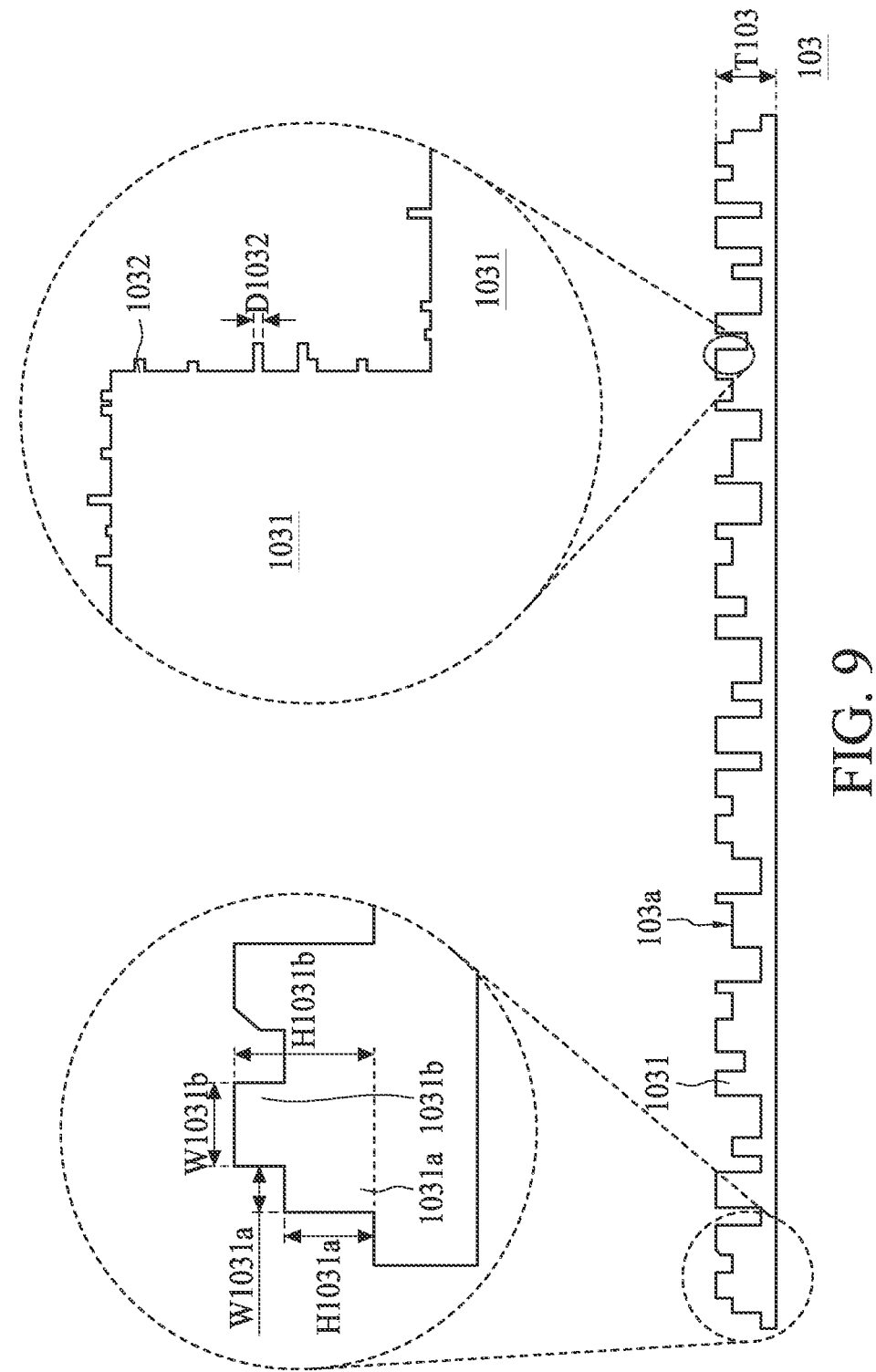

FIGS. 8 to 9 are cross-sectional diagrams in accordance with some embodiments of the present disclosure, and show the operation O103 of the method M10. The paramagnetic part 103 received in the operation O101 is subjected to a sandblasting operation SB. Particles hit a top surface of the paramagnetic part 103 to form the rough surface 103a with an irregular pattern. A plurality of protrusion structures 1031 with an irregular arrangement may be formed, wherein the protrusion structures 1031 can include different heights, different widths, and different shapes. In some embodiments, the protrusion structures 1031 include a protrusion structure 1031a and a protrusion structure 1031b adjacent to each other. The protrusion structure 1031a has a height H1031a and a width W1031a, and the protrusion structure 1031b has a height H1031b and a width W1031b. In some embodiments, the protrusion structure 1031a and the protrusion structure 1031b are side by side and in contact with each other. In some embodiments, the height H1031a of the protrusion structure 1031a is less than the height H1031b of the protrusion structure 1031b. In some embodiments, the width W1031a of the protrusion structure 1031a is less than the width W1031b of the protrusion structure 1031b. In some embodiments, configurations of the protrusion structures 1031 are different, as shown in an enlarged view of a portion of the paramagnetic part 103 as shown on the left side of FIG. 9. In some embodiments, heights of the protrusion structures 1031 are smaller than a thickness T103 of the paramagnetic part 103.

Figure 10:
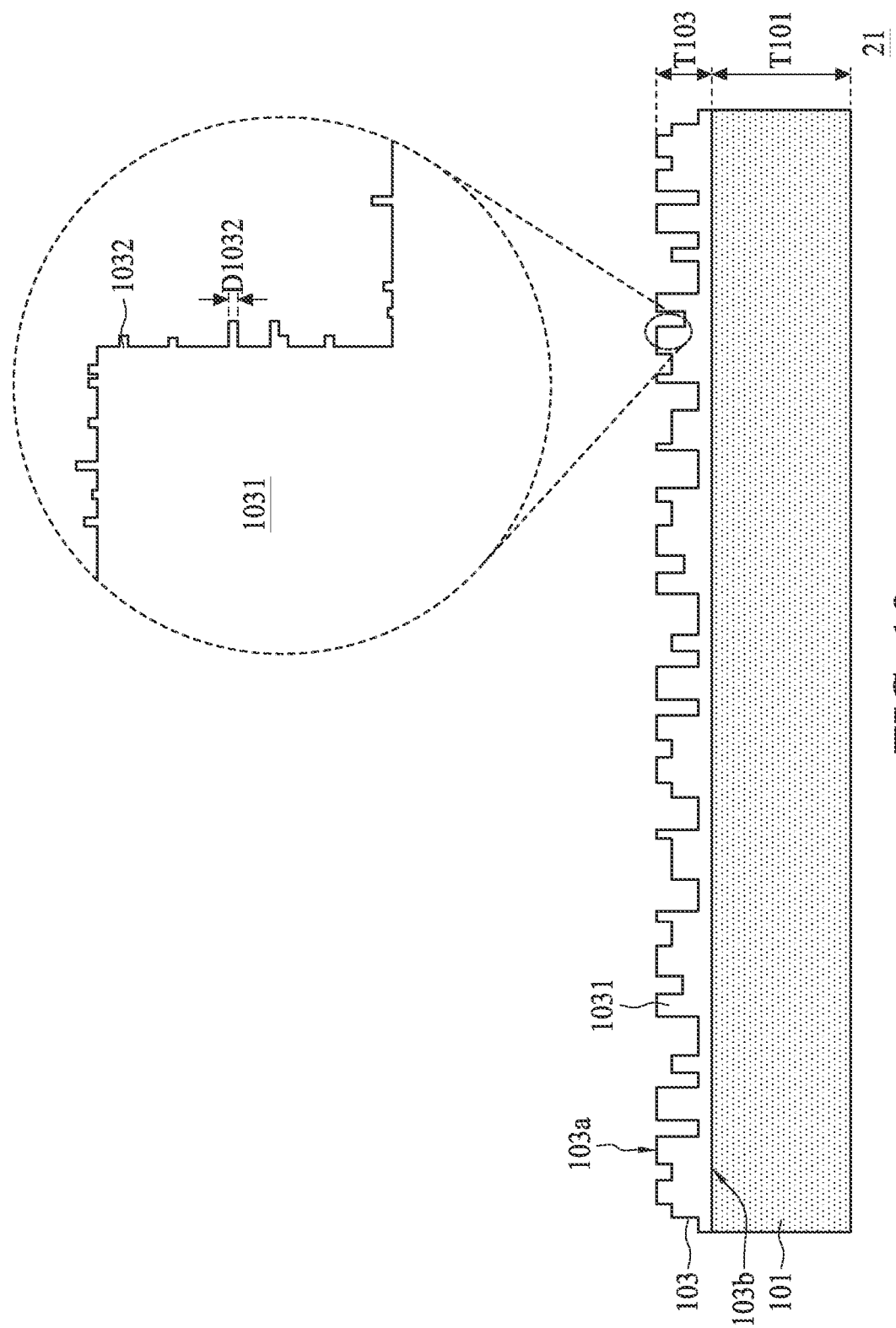

FIG. 10 is a cross-sectional diagram in accordance with some embodiments of the present disclosure and shows the operation O102 of the method M10 applied to the paramagnetic part 103 of FIG. 9. The paramagnetic part 103, with the irregular rough surface 103a, is disposed on the magnetic substrate 101 to form the reticle-masking structure 21 similar to the reticle-masking structure 20. In some embodiments, the irregular protrusion structures 1031 are configured to diffuse EUV radiation beams.

In some embodiments, the operation O102 is performed prior to the operation O103. As shown in FIG. 11, after receiving a magnetic substrate 101, as in the operation O101, the operation O102 is performed. A paramagnetic part 103 is disposed on the magnetic substrate 101. In some embodiments, the paramagnetic part 103 includes a planar surface 103b (bottom surface), and the magnetic substrate 101 is proximal to the planar surface 103b of the paramagnetic part 103. In some embodiments, the paramagnetic part 103 is received as illustrated in FIG. 4 and relevant descriptions thereof, and then the paramagnetic part 103 is disposed on the magnetic substrate 101. In some embodiments, the paramagnetic part 103 is attached to or bonded on the magnetic substrate 101 using one or more screws, an adhesive layer or a glue layer. In some embodiments, the paramagnetic part 103 is attached to or bonded on the magnetic substrate 101 by welding. In some embodiments, the paramagnetic part 103 is attached to the magnetic substrate 101 by magnetic attraction. In some embodiments, the paramagnetic part 103 is formed on the magnetic substrate 101 by electroplating or deposition.

Referring to FIGS. 12 to 13, the operation O103 is performed on the structure shown in FIG. 11. In some embodiments, similar to the operation as illustrated in FIG. 5 and relevant descriptions thereof, a patterned mask layer PM is formed and a process ET is performed to form a rough surface 103a of the paramagnetic part 103. A reticle-masking structure 12 is thereby formed, as shown in FIG. 13. In some embodiments, a sandblasting operation SB, as illustrated in FIG. 8 and described in relevant paragraphs, is performed to form a rough surface 103a with an irregular pattern. In some embodiments, some of protrusion structures 1031 have a rounded top, as shown in FIG. 13. In some embodiments, some of the protrusion structures 1031 have relatively planar tops, and configurations of the protrusion structures 1031 are not limited herein. In some embodiments, heights H1031 of the protrusion structures 103 are smaller than a thickness T103 of the paramagnetic part 103. In some embodiments, the fractions 1032 become a plurality of magnets after the paramagnetic part 103 is attached to the magnetic substrate 101. The fractions 1032 may temporarily include magnetic poles with different polarities after the fractions 1032 separate from the rough surface during the EUV operation. If the magnetic substrate 101 is exposed, it is possible for the separated fraction 1032 to be repelled from the magnetic substrate when a magnetic pole of the fraction 1032 having a same polarity as the exposed portion of the magnetic substrate 101 comes into contact with or proximity to the magnetic substrate 101. In some embodiments, a top surface 101a of the magnetic substrate 101 is attached to and entirely covered by the planar surface 103b of the paramagnetic part 103.

The magnetic substrate 101 provides a magnetic field strong enough to create an induced magnetic field in the paramagnetic part 103, wherein the induced magnetic field is strong enough to attract separated fractions 1032. In some embodiments, strength of the magnetic field of the magnetic substrate depends on a thickness of the paramagnetic part 103 and on a quantity of protrusion structures 1031 of the paramagnetic part 103. In some embodiments, the strength of the magnetic field is greater than 1000 G. In some embodiments, the magnetic substrate 101 includes one magnet. In some embodiments, the magnetic substrate 101 includes multiple magnets, wherein one magnet includes one south magnetic pole and one north magnetic pole. In some embodiment, a quantity of protrusion structures 1031 of the paramagnetic part 103 covered by one magnetic field depend on strength of the magnetic field and difficulty of fabricating the magnetic substrate 101 with a certain arrangement of the magnetic field(s). In some embodiments, a number of the protrusion structures 1031 of the paramagnetic part 103 covered by one magnetic field is in a range of 6-6000.

Figure 16:
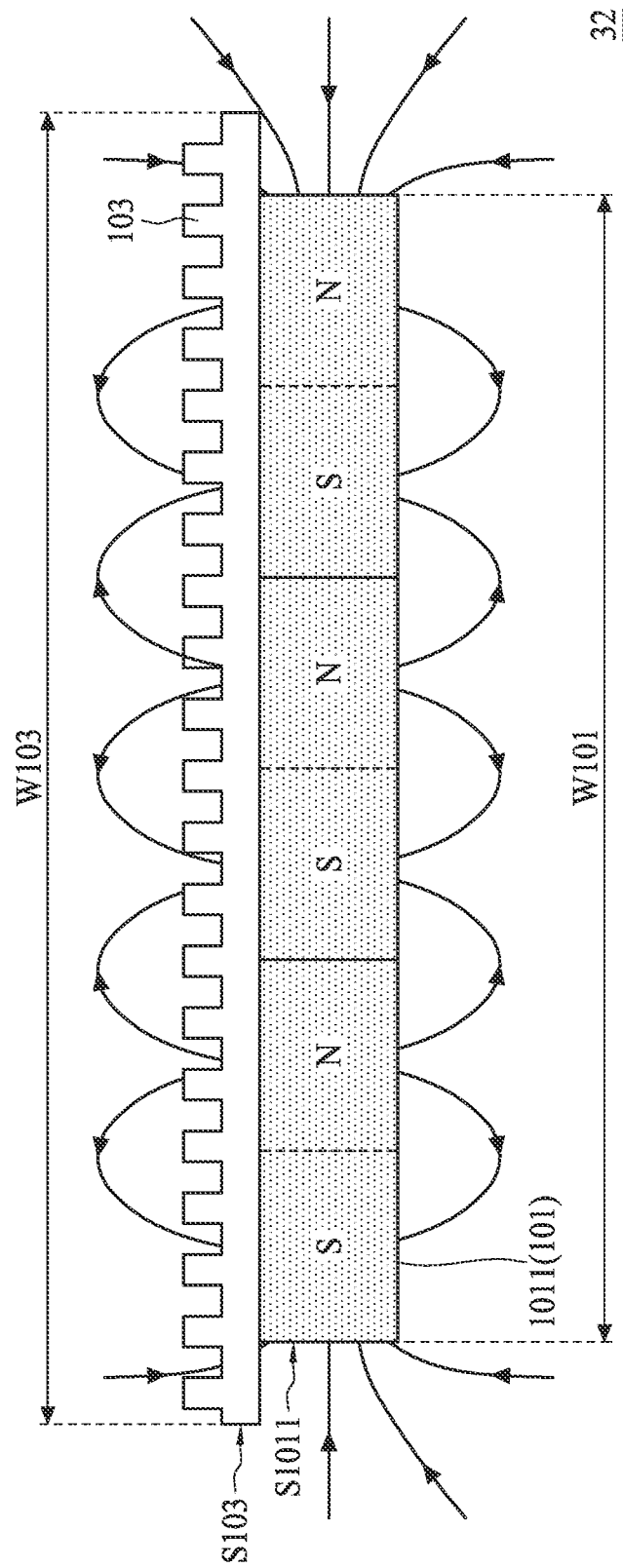
Figure 17:
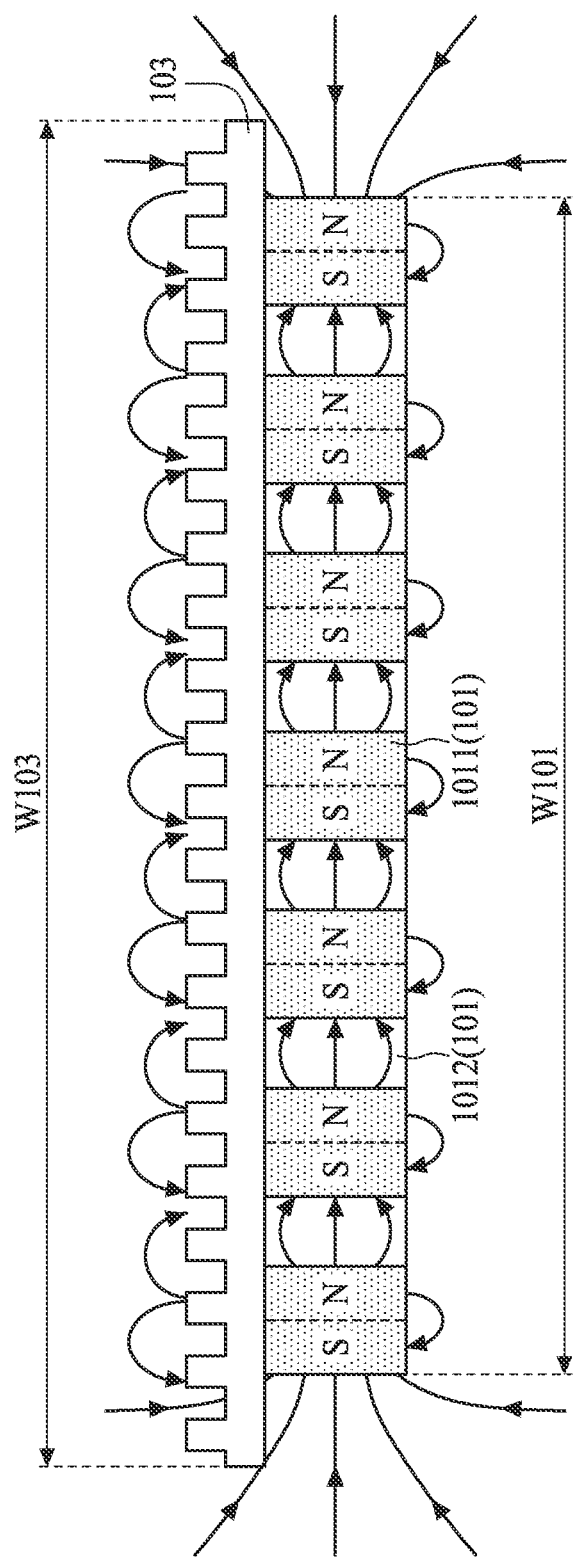
Figure 18:
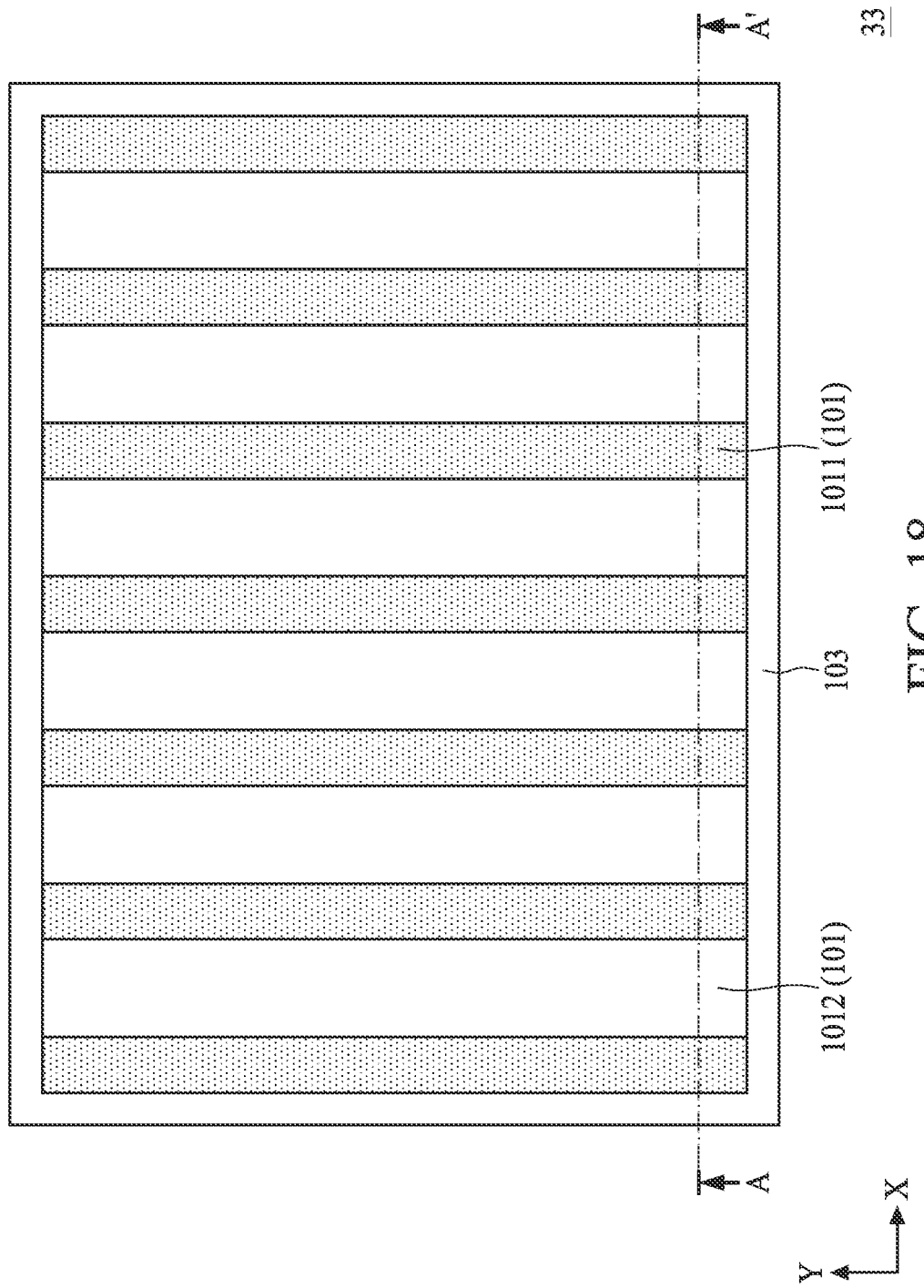
FIGS. 18 to 19 are bottom views of a portion of reticle-masking structures in accordance with some embodiments of the present disclosure.
Figure 19:
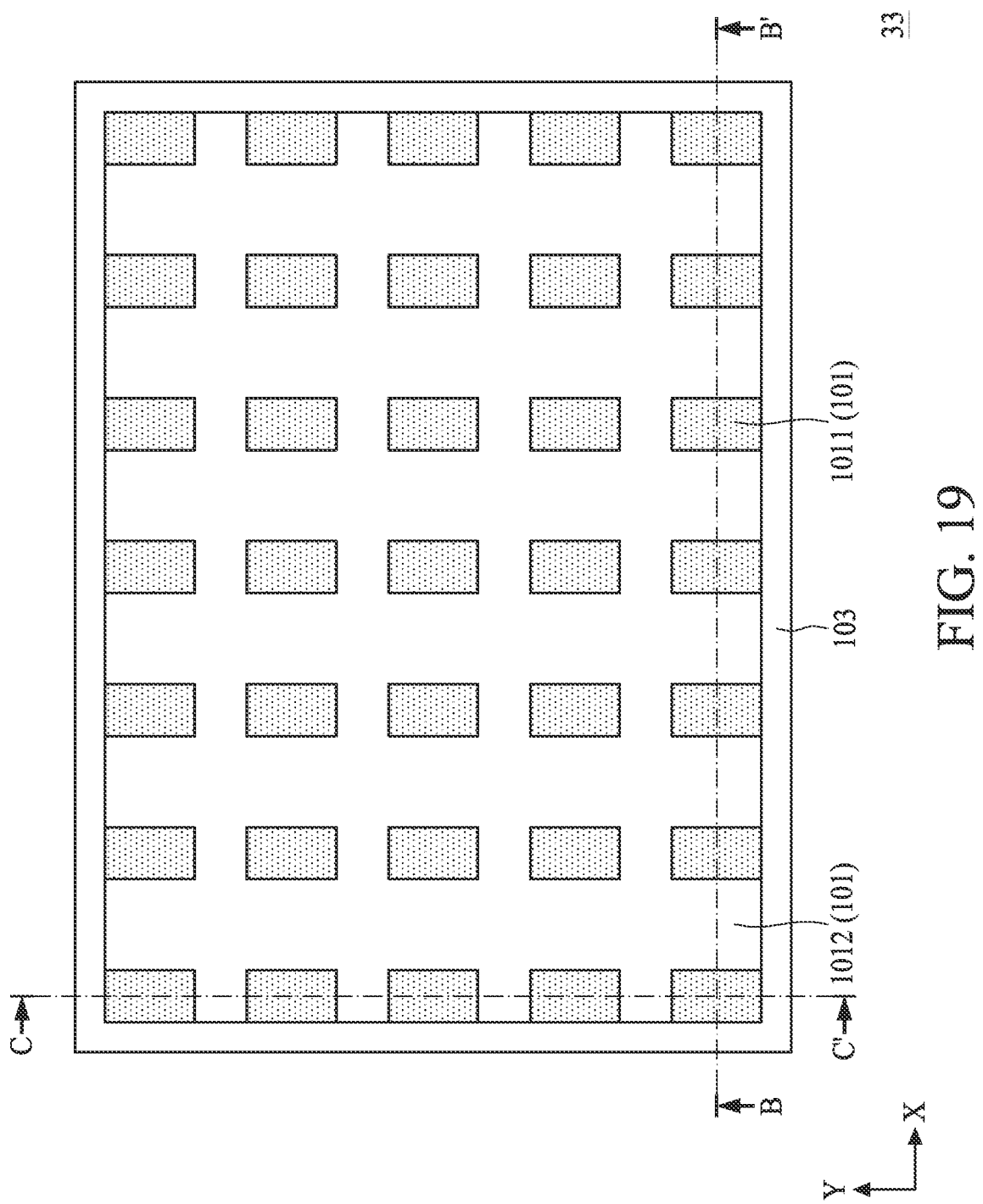

FIGS. 14 to 17 and FIGS. 20 to 22 are cross-sectional views and FIGS. 18 to 19 are bottom views of different reticle-masking structures in accordance with different embodiments of the present disclosure. In the embodiments shown in FIGS. 14 to 17 and FIGS. 20 to 22, a rough surface 103a of a paramagnetic part 103 having a designed pattern is used for a purpose of illustration, but the illustration is not intended to limit the present disclosure.

Figure 14:
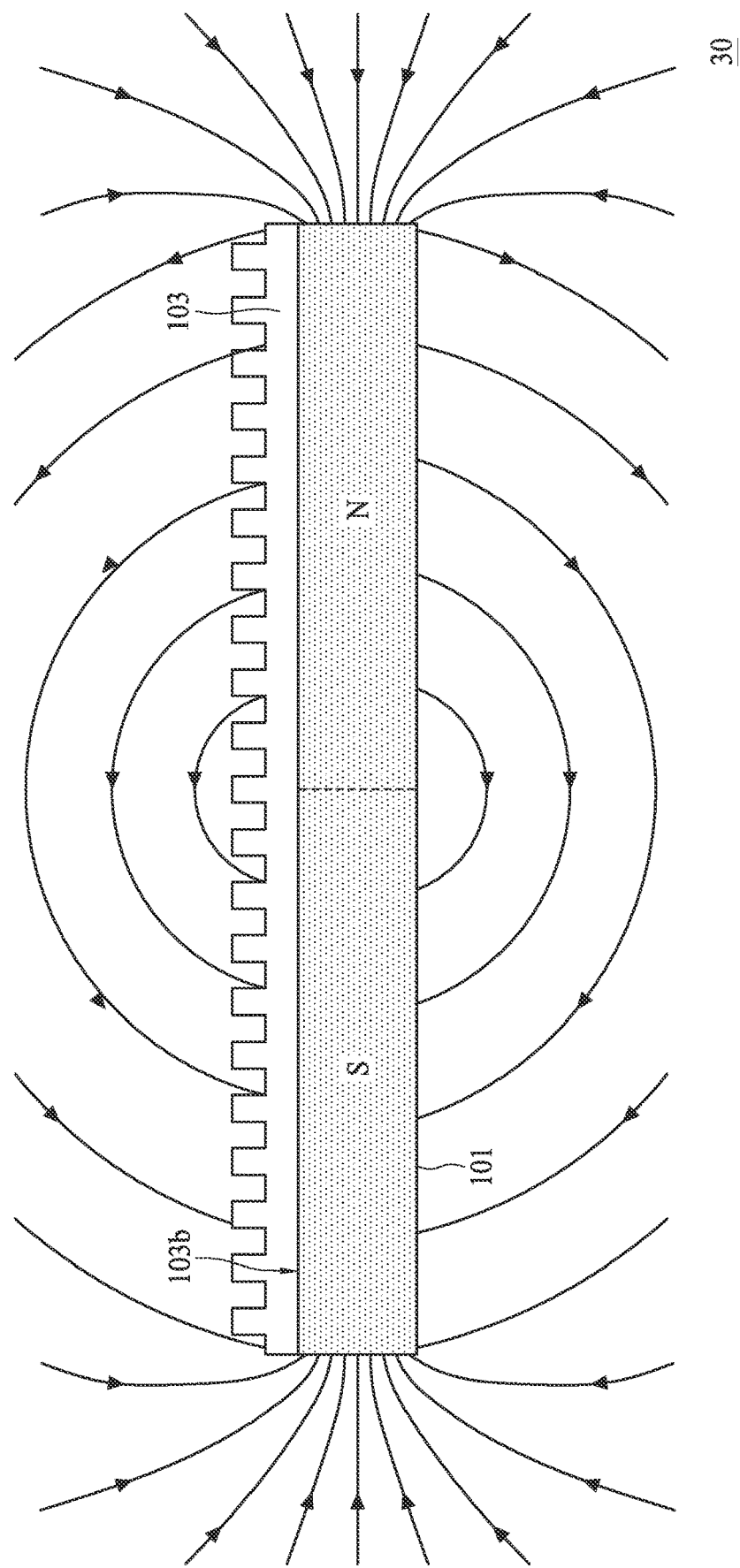
FIGS. 14 to 17 are cross-sectional diagrams of reticle-masking structures in accordance with some embodiments of the present disclosure.

Referring to FIG. 14, in accordance with some embodiments of the present disclosure, a magnetic substrate 101 of a reticle-masking structure 30 includes one magnet. The lines with arrows illustrate magnetic field lines and the directions of the magnetic field. A paramagnetic part 103 is within the magnetic field of the magnetic substrate 101, and a magnetic field is induced with a direction matching that of the magnetic field of the magnetic substrate 101. The direction of the magnetic field of the magnetic substrate 101 is from the north magnetic pole to the south magnetic pole. In some embodiments, an arrangement of a north magnetic pole (hereinafter "N pole") and a south magnetic pole (hereinafter "S pole") of the magnet of the magnetic substrate 101 is substantially parallel to a planar surface 103a of the paramagnetic part 103. In some embodiments, the arrangement of the N pole and the S pole is substantially parallel to the lengthwise direction of the paramagnetic part 103. In some embodiments, both the N pole and the S pole are in contact with the paramagnetic part 103. For ease of illustration, magnetic field lines of magnetic substrates 101 in the embodiments shown in FIGS. 15 to 20 are simplified.

Figure 15:
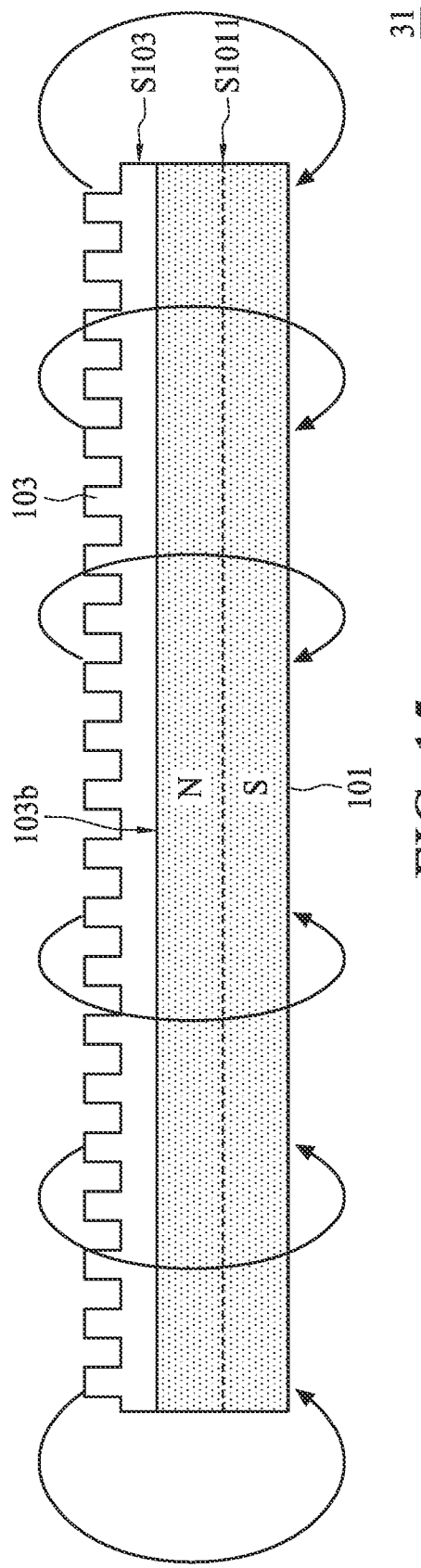

Referring to FIG. 15, in accordance with some embodiments of the present disclosure, a magnetic substrate 101 of a reticle-masking structure 31 also includes one magnet, but the direction of the arrangement of the N pole and the S pole in the reticle-masking structure 31 is different from that in the reticle-masking structure 30. In some embodiments, only one of the N pole and the S pole is in contact with the paramagnetic part 103. In some embodiments, the arrangement of the N pole and the S pole is substantially perpendicular to the planar surface 103a of the paramagnetic part 103. In some embodiments, the arrangement of the N pole and the S pole is substantially perpendicular to the lengthwise direction of the paramagnetic part 103. In some embodiment, a sidewall S1011 of an edge magnet 1011 is aligned with a sidewall S103 of the paramagnetic part 103.

Referring to FIG. 16, in accordance with some embodiments of the present disclosure, a magnetic substrate 101 of a reticle-masking structure 32 includes a plurality of magnets 1011. A paramagnetic part 103 is within magnetic fields of the magnetic substrate 101, and a plurality of magnetic fields is induced with directions matching those of the magnetic fields of the magnets 1011 of the magnetic substrate 101. In some embodiments, each of the magnets 1011 contacts an adjacent magnet 1011. In some embodiments, an N pole of a magnet 1011 contacts an S pole of the adjacent magnet 1011. In some embodiments, a width W101 of the magnetic substrate 101 is less than a width W103 of the paramagnetic part 103. In some embodiments, an arrangement of the N pole and the S pole of each of the magnets 1011 is substantially parallel to a planar surface 103b of the paramagnetic part 103. In some embodiments, the arrangement of the N pole and the S pole of each of the magnets 1011 is substantially parallel to a lengthwise direction of the paramagnetic part 103. In some embodiment, a sidewall S1011 of an edge magnet 1011 is not aligned with a sidewall S103 of the paramagnetic part 103 depends on strengths of the magnetic fields of the substrate 101. In some embodiments, all magnets 1011 are within an area of the planar surface 103b of the paramagnetic part 103.

Referring to FIG. 17, a magnetic substrate 101 of a reticle-masking structure 33 includes a plurality of magnets 1011, similar to the magnetic substrate 101 of the reticle-masking structure 32. A difference between the reticle-masking structure 33 and the reticle-masking structure 32 is that the magnets 1011 of the reticle-masking structure 33 are separated from each other. In some embodiment, the magnets 1011 are embedded in or bonded by a material structure 1012 to make the magnets 1011 and the material structure 1012 as a one-piece magnetic substrate 101. In some embodiments, a size and shape of the material structure 1012 is not limited herein as long as the material structure 1012 can connect all the magnets 1011 to form a plate-like substrate. In some embodiments, the material structure 1012 is made of dielectric materials without blocking the magnetic attractions of the magnets. Magnetic fields between the magnets 1011 induce magnetic fields in the paramagnetic part 103.

A configuration of the magnets 1011 is not limited herein. According to some embodiments, FIGS. 18 and 19 are bottom views of a portion of the reticle-masking structure 33 in accordance with different embodiments. In some embodiments as shown in FIG. 18, the magnets 1011 are all in a strip or a rectangular configuration, and the magnets 1011 are arranged parallel to each other. The plurality of magnets 1011 are arranged along a direction perpendicular to a lengthwise direction of each of the magnets. In some embodiments, the plurality of magnets 1011 extends along X direction while an extending direction of a single magnet 1011 is along Y direction According to some embodiments, FIG. 17 shows the reticle-masking structure 33 from a cross-sectional perspective taken along a line A-A' in FIG. 18. In some embodiments, each of the magnets 1011 is smaller than the magnet 1011 shown in FIG. 18, and an arrangement of the magnets 1011 or a pattern of the magnetic substrate 101 is in a grid array, as shown in FIG. 19. The plurality of magnets 1011 is arranged to extend in both the X direction and the Y direction. According to some embodiments, FIG. 17 shows the reticle-masking structure 33 from a cross-sectional perspective taken along a line B-B' in FIG. 19. According to some embodiments, FIG. 17 shows the reticle-masking structure 33 from a cross-sectional perspective taken along a line C-C' in FIG. 19. In some embodiments as shown in FIGS. 17-19, the material structure 1012 is entirely covered by and smaller than the paramagnetic part 103. However, the present disclosure is not limited herein. In some embodiments, material structure 1012 is entirely overlapped and substantially the same size as the paramagnetic part 103.

Figure 20:
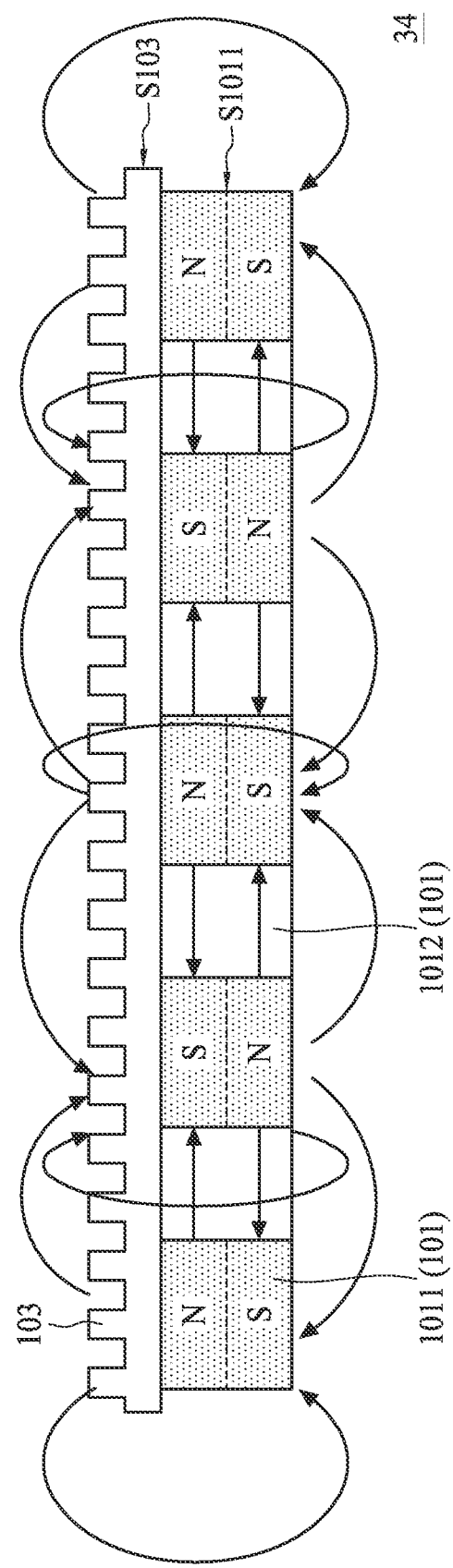
FIG. 20 is a cross-sectional diagram of a reticle-masking structure in accordance with some embodiments of the present disclosure.

FIG. 20 shows a magnetic substrate 101 of a reticle-masking structure 34 similar to the magnetic substrate 101 of the reticle-masking structure 33. A difference between the reticle-masking structure 34 and the reticle-masking structure 33 is that the arrangement of the N pole and the S pole of each magnet 1011 is substantially perpendicular to the rough surface 103a of the paramagnetic part 103. In some embodiments, the arrangement of the N pole and the S pole of each magnet 1011 is substantially perpendicular to a lengthwise direction of the paramagnetic part 103. In some embodiments, magnetic field directions of adjacent magnets 1011 are opposite.

In some embodiments, the magnets 1011 or the magnetic substrate 101 on the paramagnetic part 103 of the reticle-masking structure 34 as shown in FIG. 20 are arranged in a plurality of parallel strips similar to the bottom view shown in FIG. 18. In some embodiments, the magnets 1011 or the magnetic substrate 101 on the paramagnetic part 103 of the reticle-masking structure 34 as shown in FIG. 20 are arranged as a grid array similar to the bottom view shown in FIG. 19.

Figure 21:
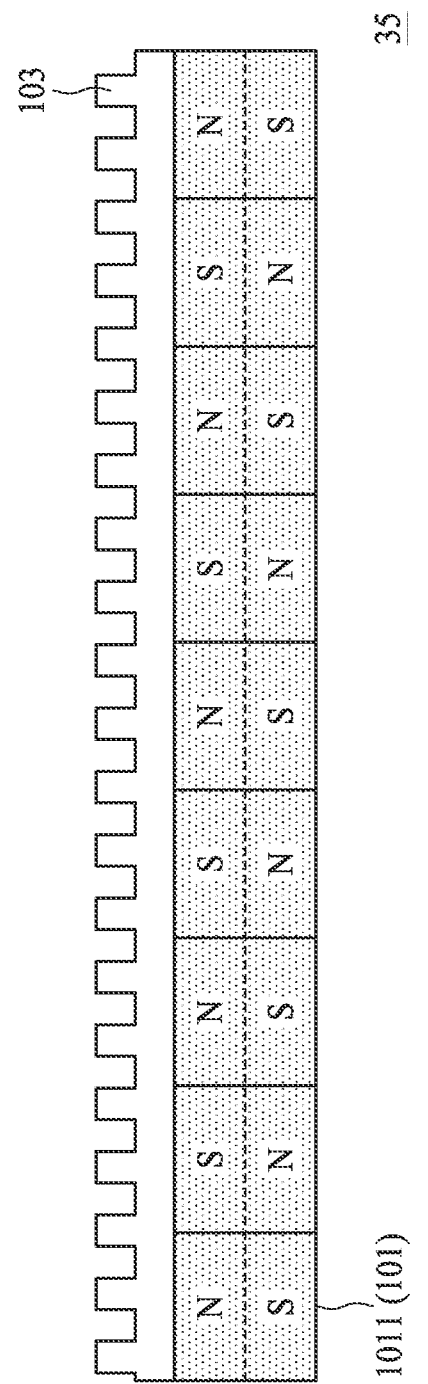
FIGS. 21 to 22 are cross-sectional diagrams of reticle-masking structures in accordance with some embodiments of the present disclosure.

FIG. 21 shows a magnetic substrate 101 of a reticle-masking structure 35 similar to the magnetic substrate 101 of the reticle-masking structure 34. A difference between the reticle-masking structure 35 and the reticle-masking structure 34 is that in the reticle-masking structure 35, magnets 1011 are in contact with adjacent magnets 1011 instead of being separated from each other. In some embodiments, the N poles and the S poles of the magnets 1011 are alternately arranged. Magnetic field lines of the reticle-masking structure 35 are similar to those of the reticle-masking structure 34 shown in FIG. 20, and for ease of illustration, magnetic field lines are omitted in FIG. 23.

Figure 22:
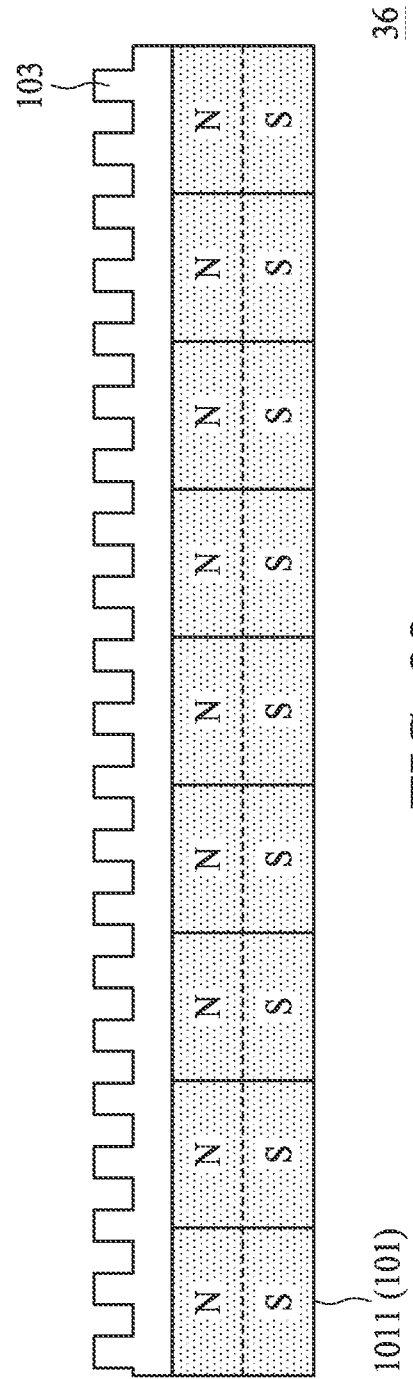

FIG. 22 shows a magnetic substrate 101 of a reticle-masking structure 36 similar to the magnetic substrate 101 of the reticle-masking structure 35. A difference between the reticle-masking structure 36 and the reticle-masking structure 35 is that in the reticle-masking structure 36, same polarities of adjacent magnets 1011 are aligned. In some embodiments, the N poles of the magnets 1011 are in contact with the paramagnetic part 103 and an N pole of a magnet 1011 is in contact a N pole of an adjacent magnets 1011, as shown in FIG. 22. In some embodiments, the S poles of the magnets 1011 are in contact with the paramagnetic part 103. Magnetic field lines of the reticle-masking structure 36 are similar to those of the reticle-masking structure 31 shown in FIG. 15, and for ease of illustration, magnetic field lines are omitted in FIG. 24.

Figure 23:
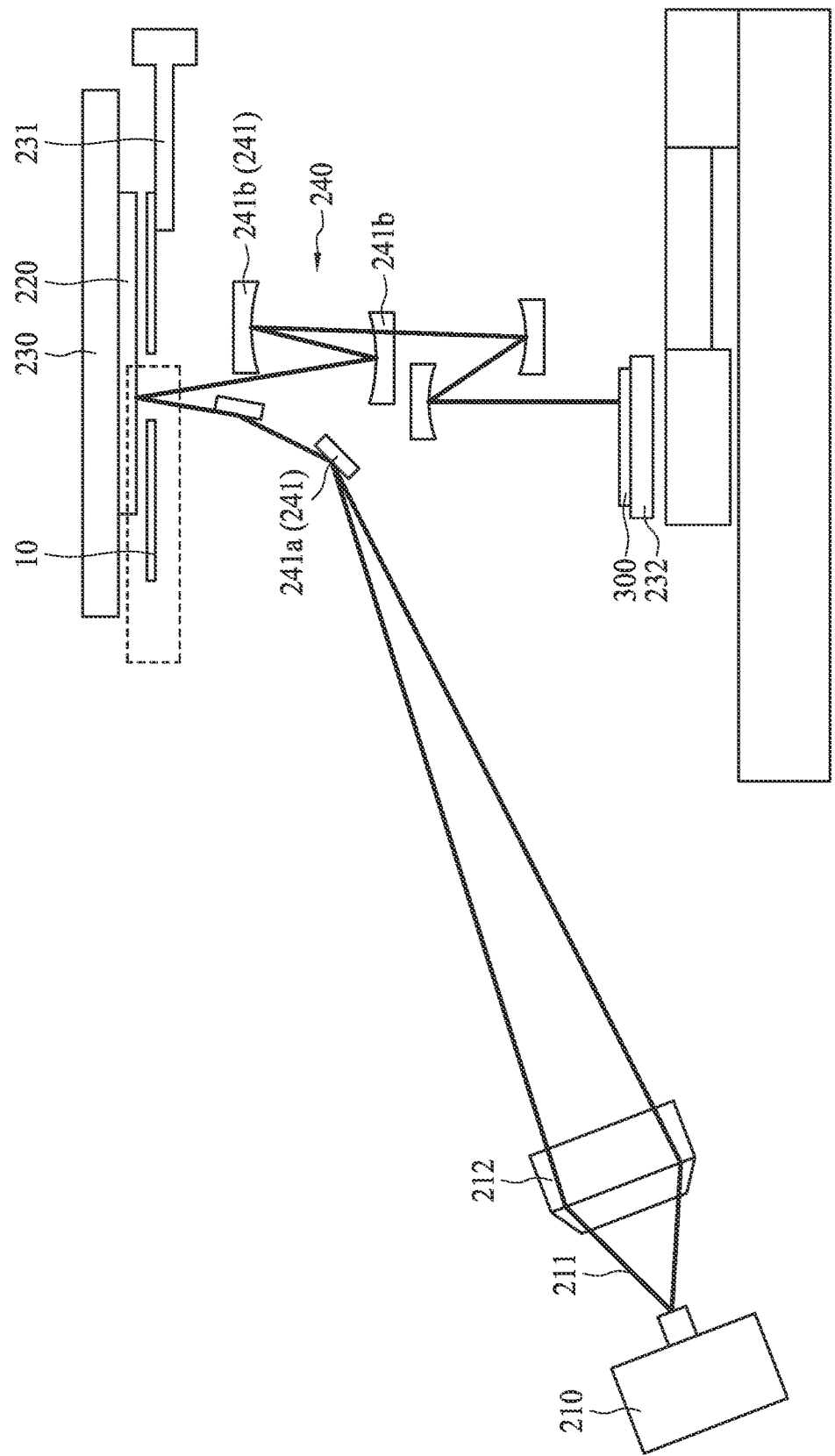
FIG. 23 is a cross-sectional diagram of an extreme ultraviolet apparatus in accordance with some embodiments of the present disclosure.

In some embodiments of the present disclosure, an EUV apparatus is provided including one of the above illustrated reticle-masking structures. Referring to FIG. 23, an EUV apparatus A10 in accordance with some embodiments of the present disclosure is provided. The EUV apparatus A10 includes a radiation source 210, a reticle-masking structure 10, and a reticle 220. In some embodiments, the radiation source 210 is configured to generate a radiation beam 211 (e.g., EUV rays). In some embodiments, the reticle-masking structure 10 is replaced by one of the above-described reticle-masking structures 11, 12, 20, 21, or 30 to 36. The reticle-masking structure 10 is used herein for a purpose of illustration, but is not intended to limit the present disclosure. In some embodiments, the reticle-masking structure is configured to diffuse a portion of the radiation beam 211. In some embodiments, the reticle 220 is configured to reflect the remaining portion of the radiation beam after the diffusion of the portion of the radiation beam in order to transfer a pattern of the reticle 220 onto a wafer 300.

In some embodiments, the apparatus A10 further includes an optical collector 212, configured to concentrate the radiation beam 211 generated by the radiation source 210 onto the reticle 220. In some embodiments, the apparatus A10 further includes an optical system 240, configured to receive the radiation beam 211 from the radiation source 210 and reflect the radiation beam 211 onto the reticle 220 and then onto the wafer 300. In some embodiments, the optical system 240 includes a plurality of mirrors 241, configured to reflect the radiation beam 211 from the radiation source 210 toward the reticle 220. In some embodiments, the plurality of mirrors 241 are also configured to reduce a size of the pattern of the reticle 220 and reflect the radiation beam 211 onto the wafer 300. In some embodiments, the plurality of mirrors 241 include a plurality of plane mirrors 241a to reflect the radiation beam 211 from the radiation source 210 toward the reticle 220. In some embodiments, the plurality of mirrors 241 include a plurality of concave mirrors 241b configured to concentrate the radiation beam 211 reflected by the reticle 220 in order to reduce the size of the pattern of the reticle 220.

In some embodiments, the apparatus A10 further includes a reticle stage 230 configured to load or carry the reticle 220. In some embodiments, the apparatus A10 further includes a masking carrier 231, configured to load or carry the reticle-masking structure 10. In some embodiments, the masking carrier 231 includes a motor (not shown), configured to adjust a position of the reticle-masking structure 10. In some embodiments, the apparatus A10 further includes a wafer stage 232, configured to load or carry the wafer 300. In some embodiments, the wafer stage 232 includes a motor (not shown), configured to adjust a position of the wafer 300.

Figure 24:
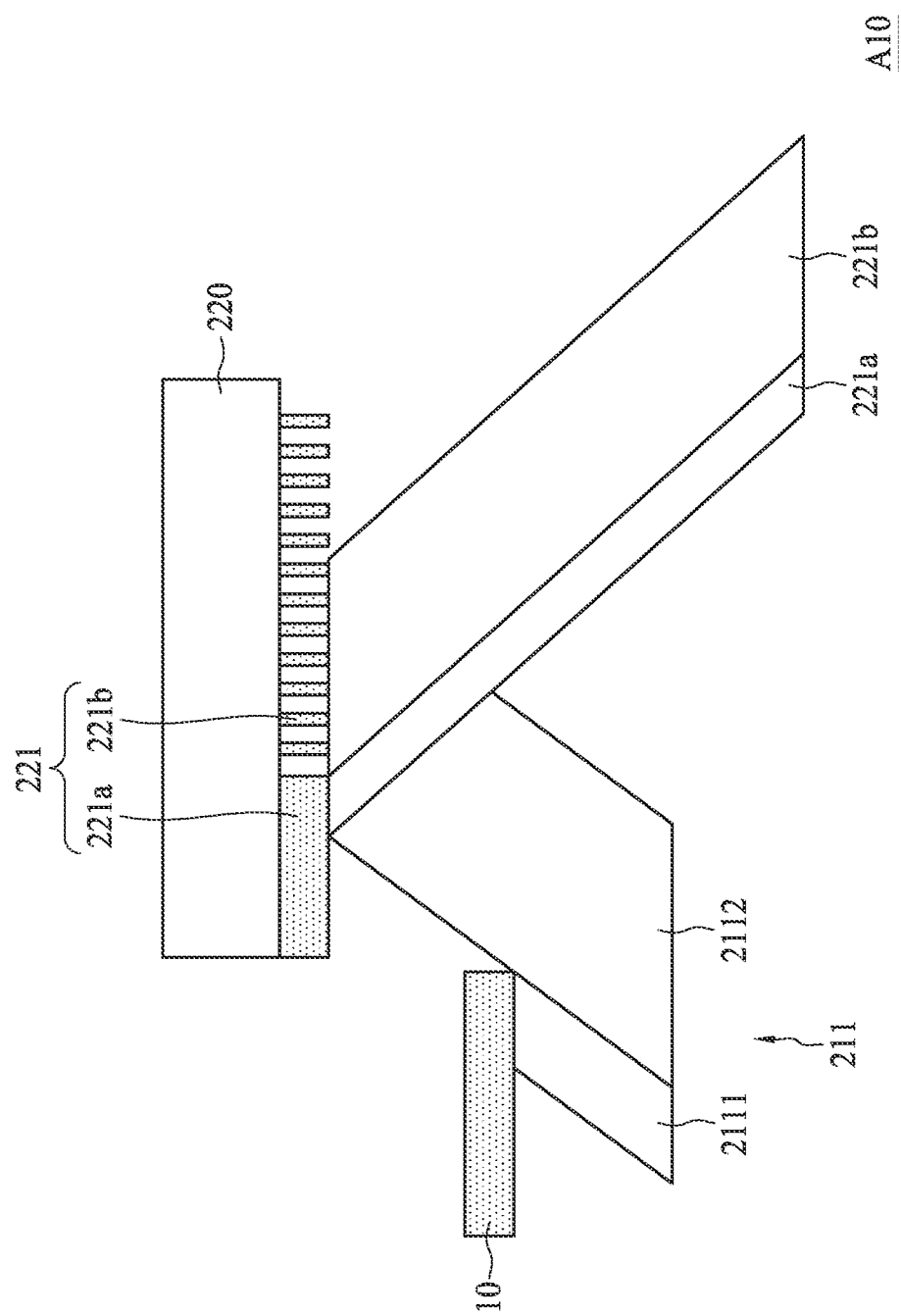
FIGS. 24 to 25 are cross-sectional diagrams of applications of a reticle-masking structure in an apparatus in accordance with some embodiments of the present disclosure.
Figure 25:
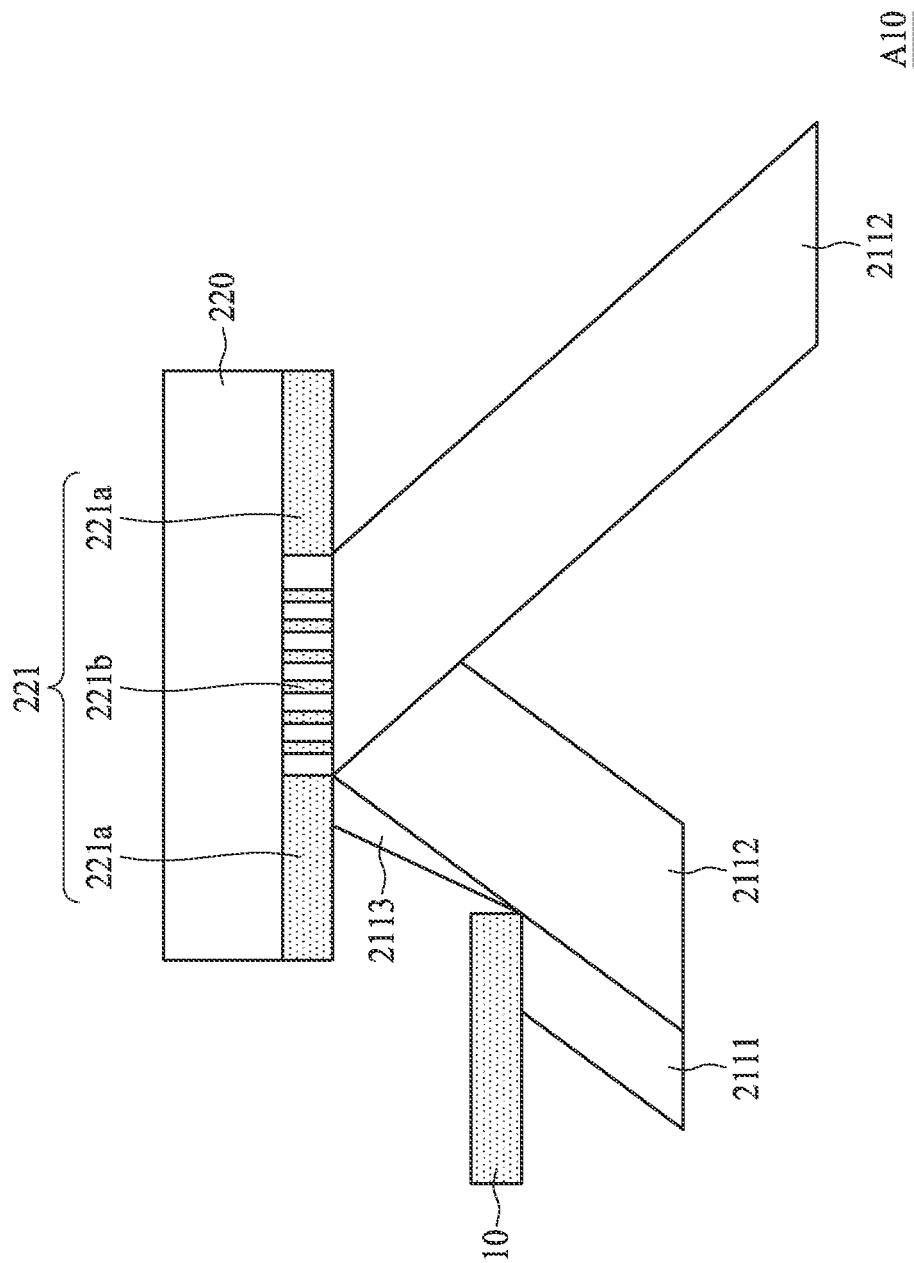

In order to further illustrate functions of the apparatus and the reticle-masking structure of the present disclosure, FIGS. 24 to 25 show an enlarged view of a portion (indicated with a dashed-line box in FIG. 23) of the apparatus A10 during an EUV lithographic operation performed by the apparatus A10 in accordance with different embodiments.

In some embodiments, as shown in FIG. 24, the radiation beam 211 from the radiation source 210 includes a first portion 2111 and a second portion 2112. The first portion 2111 is a portion of the radiation beam 211 that is to be prevented from irradiating the wafer 300. The first portion 2111 is radiated onto the rough surface 103a of the reticle-masking structure 10 and is diffused by the rough surface 103a. In some embodiments, during a lithographic operation, the radiation beam 211 (e.g., EUV light) gives energy to the fractions 1032, causing the fractions 1032 to separate from the rough surface 103a, after the reticle-masking structure 10 being irradiated by the first portion 2111 of the radiation beam 211. In some embodiments, the separated fractions 1032 are attracted back to the rough surface 103a by the magnetic forces of the magnetic substrate 101 and the paramagnetic part 103. In some embodiments, the fractions 1032 are attached to the rough surface 103a of the paramagnetic part 103 by magnetic attraction. In some embodiments, positions of the fractions 1032 on the rough surface 103a changes during the EUV lithographic operation. In some embodiments, the fractions 1032 are remained steadily on the rough surface 103a of the paramagnetic part 103 by strong magnetic attraction during the EUV lithographic operation.

The second portion 2112 of the radiation beam 211 is reflected by the reticle 220. In some embodiments, the reticle 220 includes a pattern 221, and the pattern 221 includes an edge pattern 221a and a chip pattern 221b. In some embodiments, the second portion 2112 is reflected by a portion of the reticle 220 having the chip pattern 221b and at least a portion of the edge pattern 221a. In some embodiments, an image of the edge pattern 221a is substantially transferred to a scribe line region of the wafer 300. In some embodiments, a first sub-portion 211a of the second portion 2112 of the radiation beam 211 is reflected by a portion of the reticle 220 having the edge pattern 221a. In some embodiments, the chip pattern 221b may correspond to a layout pattern constituting integrated circuits. In some embodiments, an image of the chip pattern 221b is transferred to a die region of the wafer 300. In some embodiments, a second sub-portion 211b of the second portion 2112 of the radiation beam 211 is reflected by a portion of the reticle 220 having the chip pattern 221b.

In some embodiments, as shown in FIG. 25, similar to the embodiments shown in FIG. 26, the radiation beam 211 from the radiation source 210 includes a first portion 2111 and a second portion 2112, wherein the rough surface 103a of the reticle-masking structure 10 helps to diffuses the first portion 2111 so that the reflection of the first portion 2111 is reduced. The second portion 2112 is reflected by the reticle 220, particularly by the chip pattern 221b. A difference between the embodiments shown in FIG. 27 and the embodiments shown in FIG. 24 is that, in the embodiments shown in FIG. 27, the second portion 2112 is substantially reflected by a portion of the reticle 220 having substantially the chip pattern 221b. In some embodiments, the radiation beam 211 further includes a penumbra portion 2113 after the radiation beam 211 is radiated onto the reticle-masking structure 10. In some embodiments, the penumbra portion 2113 is projected onto a portion of the reticle 220 having the edge pattern 221a. In some embodiments, a light intensity of the penumbra portion 2113 is very low, and the penumbra portion 2113 is not able to transfer an image of the edge pattern 221a onto the wafer 300. In some embodiments, the penumbra portion 2113 is reflected by the portion of the reticle 220 having the edge pattern 221a.

Some embodiments of the present disclosure provide a reticle-masking structure. The reticle-masking structure includes a magnetic substrate and a paramagnetic part disposed on the magnetic substrate. The paramagnetic part includes a plurality of fractions disposed on a plurality of protrusion structures. In some embodiments, the plurality of protrusion structures are irregularly arranged.

Some embodiments of the present disclosure provide a method for forming a reticle-masking structure. The method includes: receiving a magnetic substrate; disposing a paramagnetic part on the magnetic substrate; removing a portion of the paramagnetic part to form an irregular pattern of a rough surface; and forming a plurality of fractions on the rough surface.

Some embodiments of the present disclosure provide an extreme ultraviolet apparatus. The extreme ultraviolet apparatus includes: a radiation source, a reticle-masking structure and a reticle. The radiation source generates a radiation beam, and the reticle-masking structure is configured to diffuse the radiation beam. The reticle-masking structure includes a magnetic substrate and a paramagnetic part disposed on the magnetic substrate. The paramagnetic part includes a plurality of fractions attached to a surface of the paramagnetic part. The reticle is configured to reflect the radiation beam.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A reticle-masking structure, comprising:
a magnetic substrate; and
a paramagnetic part, disposed on the magnetic substrate, wherein the paramagnetic part comprises a plurality of fractions disposed on a plurality of protrusion structures, wherein the plurality of protrusion structures are irregularly arranged.

2. The reticle-masking structure of claim 1, wherein the plurality of protrusion structures includes different heights and different diameters.

3. The reticle-masking structure of claim 1, wherein at least a portion of the plurality of protrusion structures is separated from adjacent protrusion structures.

4. The reticle-masking structure of claim 1, wherein at least a portion of the plurality of protrusion structures contacts adjacent protrusion structures.

5. The reticle-masking structure of claim 1, wherein the paramagnetic part is attracted by a magnetic field of the magnetic substrate.

6. The reticle-masking structure of claim 1, wherein the paramagnetic part is made of stainless steel.

7. The reticle-masking structure of claim 1, wherein the paramagnetic part overlaps the entire magnetic substrate.

8. The reticle-masking structure of claim 1, wherein the paramagnetic part has a width substantially equal to a width of the magnetic substrate.

9. A method for forming a reticle-masking structure, comprising:
receiving a magnetic substrate;
disposing a paramagnetic part on the magnetic substrate;
removing a portion of the paramagnetic part to form an irregular pattern of a rough surface; and
forming a plurality of fractions on the rough surface.

10. The method of claim 9, wherein the portion of the paramagnetic part is removed by a sandblasting operation.

11. The method of claim 9, wherein the portion of the paramagnetic part is removed to form a plurality of protrusion structures.

12. The method of claim 9, wherein the paramagnetic part is disposed on the magnetic substrate prior to the removal of the portion of the paramagnetic part.

13. The method of claim 9, wherein the paramagnetic part is disposed on the magnetic substrate after the removal of the portion of the paramagnetic part.

14. The method of claim 9, further comprising:
performing a cleaning operation or a surface treatment after the removal of the portion of the paramagnetic part to form the plurality of fractions.

15. The method of claim 9, wherein the plurality of fractions includes paramagnetic particles.

16. An extreme ultraviolet apparatus, comprising:
a radiation source, generating a radiation beam;
a reticle-masking structure, configured to diffuse the radiation beam, wherein the reticle-masking structure includes:
a magnetic substrate; and a paramagnetic part, disposed on the magnetic substrate, wherein the paramagnetic part comprises a plurality of fractions attached to a surface of the paramagnetic part; and a reticle, configured to reflect the radiation beam.

17. The extreme ultraviolet apparatus of claim 16, further comprising:
a wafer stage, carrying a wafer, wherein the radiation beam projects a pattern of the reticle onto the wafer on the wafer stage.

18. The extreme ultraviolet apparatus of claim 16, further comprising:
an optical system, configured to receive the radiation beam from the radiation source and reflect the radiation beam onto the reticle.

19. The extreme ultraviolet apparatus of claim 16, wherein a material of the paramagnetic part includes stainless steel.

20. The extreme ultraviolet apparatus of claim 16, wherein the plurality of fractions includes pillar-like, irregular, micro-branch, or micro-bulge paramagnetic fractions.

* * * * *